(12) United States Patent
Jennings et al.

(10) Patent No.: US 7,872,209 B2
(45) Date of Patent: Jan. 18, 2011

(54) THERMAL FLUX PROCESSING BY SCANNING A FOCUSED LINE BEAM

(75) Inventors: Dean C. Jennings, Beverly, MA (US);
Mark Yam, Monte Sereno, CA (US);
Abhilash J. Mayur, Salinas, CA (US);
Vernon Behrens, Quincy, CA (US);
Paul A. O'Brien, San Jose, CA (US);
Leonid M. Tertitski, San Jose, CA (US);
Alexander Goldin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 11/924,298

(22) Filed: Oct. 25, 2007

(65) Prior Publication Data

US 2008/0041831 A1    Feb. 21, 2008

Related U.S. Application Data

(60) Continuation of application No. 11/561,784, filed on Nov. 20, 2006, which is a continuation of application No. 11/079,785, filed on Mar. 14, 2005, which is a division of application No. 10/325,497, filed on Dec. 18, 2002, now Pat. No. 6,987,240, which is a continuation-in-part of application No. 10/202,119, filed on Jul. 23, 2002, now Pat. No. 7,078,651, which is a continuation-in-part of application No. 10/126,419, filed on Apr. 18, 2002, now Pat. No. 7,005,601, application No. 11/924,298, which is a continuation-in-part of application No. 10/261,379, filed on Sep. 30, 2002.

(51) Int. Cl.
*B23K 26/08* (2006.01)
*B23K 26/10* (2006.01)

(52) U.S. Cl. .............................. 219/121.8; 219/121.75; 219/121.78

(58) Field of Classification Search ............... 219/121.8, 219/121.73, 121.75, 121.78
See application file for complete search history.

(56) References Cited

U.S. PATENT DOCUMENTS 3,720,784 A    3/1973    Mayden et al.
(Continued)

FOREIGN PATENT DOCUMENTS

CN    1131341    9/1996
(Continued)

OTHER PUBLICATIONS

Meyerson et al., "Experimental and chemical kinetic modeling study of silicon CVC from monosilane and disilane," Chemtronics, vol. 1, Dec. 1989, pp. 150-155.
(Continued)

*Primary Examiner*—M. Alexandra Elve
(74) *Attorney, Agent, or Firm*—Townsend and Townsend and Crew, LLP

(57) ABSTRACT

The thermal processing device includes a stage, a continuous wave electromagnetic radiation source, a series of lenses, a translation mechanism, a detection module, a three-dimensional auto-focus, and a computer system. The stage is configured to receive a substrate thereon. The continuous wave electromagnetic radiation source is disposed adjacent the stage, and is configured to emit continuous wave electromagnetic radiation along a path towards the substrate. The series of lenses is disposed between the continuous wave electromagnetic radiation source and the stage, and are configured to condense the continuous wave electromagnetic radiation into a line of continuous wave electromagnetic radiation on a surface of the substrate. The translation mechanism is configured to translate the stage and the line of continuous wave electromagnetic radiation relative to one another. The detection module is positioned within the path, and is configured to detect continuous wave electromagnetic radiation.

14 Claims, 20 Drawing Sheets

U.S. PATENT DOCUMENTS

| | | | |
|---|---|---|---|
| RE28,375 E | 3/1975 | Maydan et al. | |
| 4,151,008 A | 4/1979 | Kirkpatrick | |
| 4,309,225 A | 1/1982 | Fan et al. | |
| 4,469,551 A | 9/1984 | Laude | |
| 4,520,472 A | 5/1985 | Reno | |
| 4,868,005 A | 9/1989 | Ehrlich et al. | |
| 5,266,502 A | 11/1993 | Okada et al. | |
| 5,269,847 A | 12/1993 | Anderson et al. | |
| 5,323,269 A | 6/1994 | Walker et al. | |
| 5,357,365 A | 10/1994 | Ipposhi et al. | |
| 5,463,534 A | 10/1995 | Raven | |
| 5,508,067 A | 4/1996 | Sato et al. | |
| 5,529,630 A | 6/1996 | Imahashi et al. | |
| 5,612,251 A | 3/1997 | Lee | |
| 5,629,217 A | 5/1997 | Miwa et al. | |
| 5,660,472 A | 8/1997 | Peuse et al. | |
| 5,672,861 A * | 9/1997 | Fairley et al. | 250/201.3 |
| 5,782,980 A | 7/1998 | Allen et al. | |
| 5,844,684 A | 12/1998 | Maris et al. | |
| 5,907,435 A * | 5/1999 | Ang | 359/565 |
| 5,986,234 A | 11/1999 | Matthews et al. | |
| 6,019,839 A | 2/2000 | Achutharaman et al. | |
| 6,026,053 A * | 2/2000 | Satorius | 365/235 |
| 6,054,739 A | 4/2000 | Yamazaki et al. | |
| 6,080,965 A | 6/2000 | Osawa | |
| 6,103,014 A | 8/2000 | Lei et al. | |
| 6,110,845 A | 8/2000 | Seguchi et al. | |
| 6,151,446 A | 11/2000 | Hunter et al. | |
| 6,204,483 B1 | 3/2001 | Fair et al. | |
| 6,215,106 B1 | 4/2001 | Boas et al. | |
| 6,242,292 B1 | 6/2001 | Yamazaki et al. | |
| 6,304,362 B1 * | 10/2001 | Zheludev et al. | 359/241 |
| 6,323,457 B1 | 11/2001 | Jung | |
| 6,326,246 B1 | 12/2001 | Yamamoto | |
| 6,326,248 B1 | 12/2001 | Ohtani et al. | |
| 6,337,467 B1 * | 1/2002 | Sik | 219/411 |
| 6,365,870 B1 | 4/2002 | Petring et al. | |
| 6,376,806 B2 | 4/2002 | Yoo | |
| 6,393,042 B1 * | 5/2002 | Tanaka | 372/101 |
| 6,393,043 B1 | 5/2002 | Fuchs | |
| 6,514,339 B1 | 2/2003 | Jung | |
| 6,531,681 B1 | 3/2003 | Markle et al. | |
| 6,535,535 B1 | 3/2003 | Yamazaki et al. | |
| 6,555,423 B2 | 4/2003 | Wada et al. | |
| 6,567,219 B1 | 5/2003 | Tanaka | |
| 6,628,692 B2 * | 9/2003 | Kasamatsu | 372/70 |
| 6,747,245 B2 | 6/2004 | Talwar et al. | |
| 6,759,662 B1 | 7/2004 | Li | |
| 6,796,148 B1 | 9/2004 | Borrelli et al. | |
| 6,809,012 B2 | 10/2004 | Yamazaki et al. | |
| 6,888,096 B1 | 5/2005 | Hamada | |
| 6,961,361 B1 | 11/2005 | Tanaka et al. | |
| 6,987,240 B2 | 1/2006 | Jennings et al. | |
| 7,005,601 B2 | 2/2006 | Jennings | |
| 7,078,651 B2 | 7/2006 | Jennings | |
| 7,091,411 B2 * | 8/2006 | Falk et al. | 136/258 |
| 2001/0020722 A1 | 9/2001 | Yang | |
| 2001/0027964 A1 | 10/2001 | Isaji et al. | |
| 2002/0037132 A1 | 3/2002 | Sercel et al. | |
| 2002/0098712 A1 | 7/2002 | Mavoori et al. | |
| 2003/0071312 A1 | 4/2003 | Oana et al. | |
| 2003/0128543 A1 * | 7/2003 | Rekow | 362/259 |
| 2003/0196995 A1 | 10/2003 | Jennings | |
| 2003/0196996 A1 | 10/2003 | Jennings et al. | |
| 2004/0053450 A1 | 3/2004 | Sposili et al. | |
| 2004/0063290 A1 | 4/2004 | Jennings et al. | |
| 2005/0218124 A1 | 10/2005 | Jennings et al. | |
| 2007/0108166 A1 | 5/2007 | Jennings | |

FOREIGN PATENT DOCUMENTS

| | | |
|---|---|---|
| DE | 4234342 A1 | 4/1994 |
| EP | 0836905 A1 | 4/1998 |
| GB | 2253282 A | 2/1992 |
| JP | 09040499 A | 2/1997 |
| JP | 409040500 A | 2/1997 |
| JP | 02000323428 A | 11/2000 |
| KR | 132495 | 4/1994 |
| WO | WO 01/73769 A1 | 10/2001 |
| WO | WO 03/077598 A1 | 9/2003 |
| WO | WO 03/089184 A1 | 10/2003 |

OTHER PUBLICATIONS

Kawazu., et al., "Effects of Oxygen Concentration and Annealing Sequence on Microstructure of Separation by Implanted Oxygen Wafer with High-Temperature Annealing," Japanese Journal of Applied Physics, vol. 30, No. 1, 1991, pp. 112-115, Publication Office Japanese Journal of Applied Physics, Tokyo, Japan.

Vortek Impulse Anneal, http://www.vortek.com/semi.htm, last visited Apr. 4, 2002.

Webster, John G., "Wiley Encyclopedia of Electrical and Electronics Engineering," vol. 6, pp. 565-566, 1999.

Wolf et al., "Silicon Processing for the VLSI Era," vol. 1, $2^{nd}$ ed., p. 199, Lattice Press, Sunset Beach, CA, 2000.

* cited by examiner

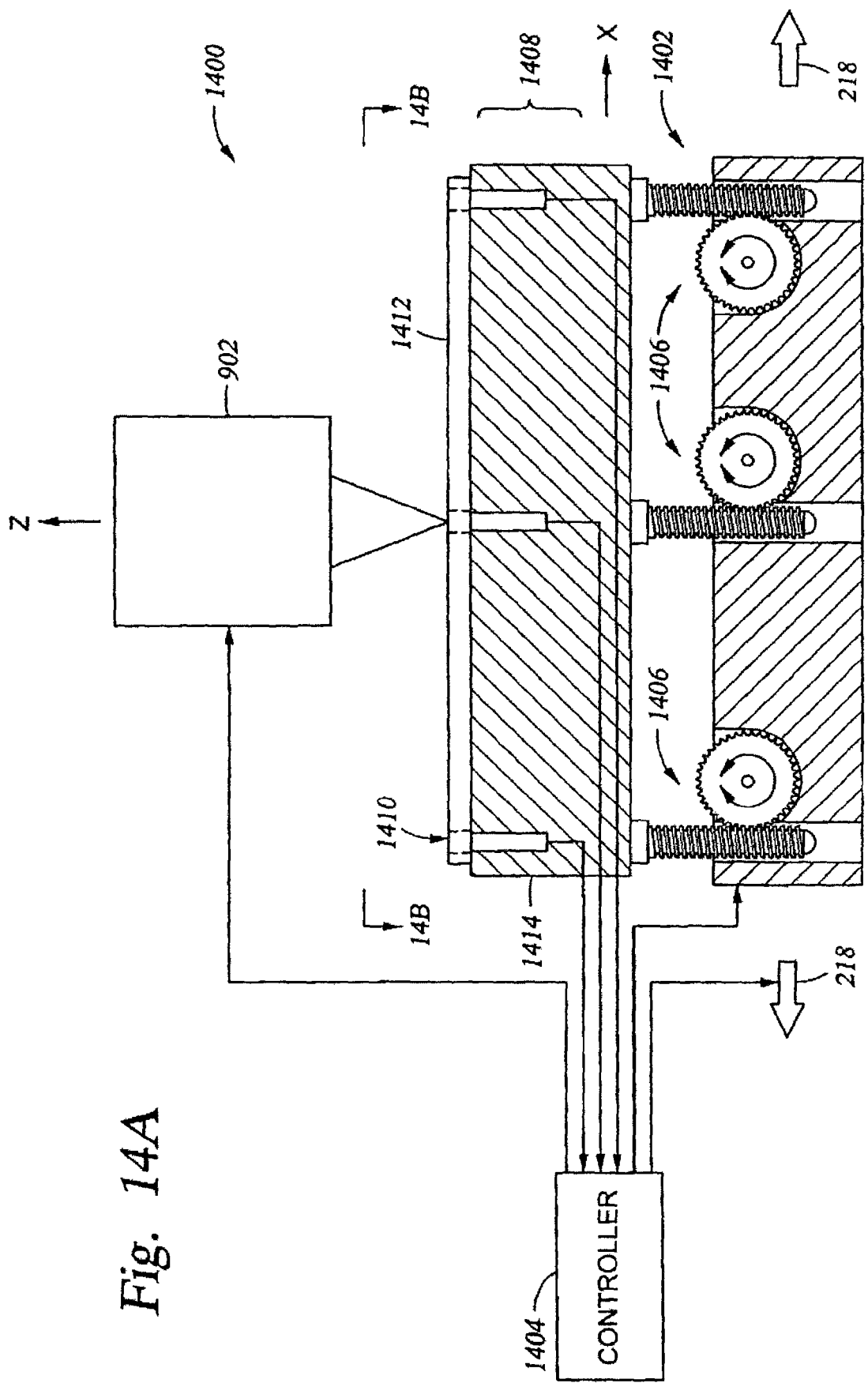

THERMAL FLUX PROCESSING BY SCANNING A FOCUSED LINE BEAM

CROSS-REFERENCES TO RELATED APPLICATIONS

This application is a continuation of U.S. patent application Ser. No. 11/561,784, filed Nov. 20, 2006, which is a continuation of U.S. patent application Ser. No. 11/079,785, filed Mar. 14, 2005, which is a divisional of U.S. patent application Ser. No. 10/325,497, filed Dec. 18, 2002 (now U.S. Pat. No. 6,987,240), which is a continuation-in-part of U.S. patent application Ser. No. 10/202,119, filed Jul. 23, 2002 (now U.S. Pat. No. 7,078,651), which is a continuation-in-part of U.S. patent application Ser. No. 10/126,419, filed Apr. 18, 2002 (now U.S. Pat. No. 7,005,601). Each of the foregoing applications is incorporated herein by reference for all purposes.

This application is also a continuation-in-part of U.S. patent application Ser. No. 10/261,379, filed Sep. 30, 2002, the entire disclosure of which is also incorporated herein by reference for all purposes.

BACKGROUND OF THE INVENTION

1. Field of the Invention

The invention relates generally to semiconductor device manufacturing. More particularly, the invention is directed to an apparatus and method for thermally processing a substrate by scanning the substrate with a line of radiation.

2. Description of Related Art

The integrated circuit (IC) market is continually demanding greater memory capacity, faster switching speeds, and smaller feature sizes. One of the major steps the industry has taken to address these demands is to change from batch processing multiple substrates, such as silicon wafers, in large furnaces to single substrate processing in small reaction chambers.

Generally, there are four basic operations performed in such batch processing fabrication, namely layering, patterning, doping, and heat treatments. Many of these operations require heating the substrate to high temperatures so that various chemical and physical reactions can take place. Of particular interest are heat treatments and layering, each of which will be discussed below.

Heat treatments are operations in which the substrate is simply heated and cooled to achieve specific results. During heat treatment no additional material is added to or removed from the substrate. Heat treatments, such as rapid thermal processing or annealing, typically require providing a relatively large amount of thermal energy (high temperature) to the substrate in a short amount of time, and thereafter rapidly cooling the substrate to terminate the thermal process. The amount of thermal energy transferred to the substrate during such processing is known as the thermal budget. The thermal budget of a material is a function of temperature and the duration of the process. A low thermal budget is desired in ultra-small IC manufacturing, which can only be provided at high temperature if the time of the process is very short.

Examples of heat treatments currently in use include rapid thermal processing (RTP) and impulse (spike) annealing. While thermal processes are widely used, current technologies are not ideal. Such technologies tend to ramp up and ramp down the temperature of the substrate too slowly, in addition to exposing the substrate to elevated temperatures for long periods. These problems become more severe with increasing substrate sizes, increasing switching speeds, and/or decreasing feature sizes.

In general, these heat treatments raise the substrate temperature under controlled condition according to a predetermined thermal recipe. The thermal recipes fundamentally consist of: a temperature that the substrate must be heated to; the rate of change of temperature, i.e., the temperature ramp-up and ramp-down rates; and the time that the thermal processing system remains at a particular temperature. For example, thermal recipes may require the substrate to be heated from room temperature to distinct temperatures of 1200° C., or more, for processing times at each distinct temperature ranging up to 60 seconds, or more.

Moreover, to meet certain objectives, such as minimal diffusion of dopants in the substrate, the amount of time that each substrate is subjected to high temperatures must be restricted. To accomplish this, the temperature ramp rates, both up and down, are preferably high.

In other words, it is desirable to be able to adjust the temperature of the substrate from a low to a high temperature, and vice versa, in as short a time as possible so as to minimize the thermal budget.

This requirement for high temperature ramp rates led to the development of rapid thermal processing (RTP), where typical temperature ramp-up rates range from 200-400° C./s, as compared to 5-15° C./minute for conventional furnaces. Typical ramp-down rates are in the range of 80-150° C./s.

FIG. 1 is a graph 100 of thermal profiles of different prior art thermal processes. As can be seen, the thermal profile 102 of a typical RTP system has a 250° C./s ramp-up rate and a 90° C./s ramp-down rate.

A drawback of RTP is that it heats the entire substrate even though the IC devices reside only in the top few microns of the substrate. The heating of the entire substrate limits how fast one can heat up and cool down the substrate. Moreover, once the entire substrate is at an elevated temperature, heat can only dissipate into the surrounding space of structures. As a result, today's state of the art RTP systems struggle to achieve 400° C./s ramp-up rates and 90° C./s ramp-down rates.

FIG. 1 also shows a thermal profile 104 of a laser annealing process. Laser annealing is used during the fabrication of thin film transistor (TFT) panels. Such systems use a laser spot to melt and recrystallize polysilicon. The entire TFT panel is exposed by scanning the laser spot across successive exposure fields on the panel. For substrate applications a laser pulse is used to illuminate an exposure field for a duration of approximately 20-40 ns, where the exposure field is obtained by rastering across and down the substrate. As can be seen from the thermal profile 104 for laser annealing, the ramp rate is nearly instantaneous at billions of degrees per second. However, the laser pulse or flash used for laser annealing is too fast and often does not provide enough time for sufficient annealing to occur for non-melt processes. Also, devices or structures next to the exposed regions may either be exposed to extreme temperatures causing them to melt, or to temperatures that are too low resulting in too little annealing. Still further, homogenization of the thermal exposure of each portion of the substrate is difficult to attain because different regions adsorb heat at different rates resulting in huge temperature gradients. The process is too fast for thermal diffusion to equilibrate temperature, thereby creating severe pattern dependencies. As a result, this technology is not appropriate for single-crystal silicon annealing because different regions on the substrate surface may be heated to vastly different temperatures causing large non-uniformities over short distances.

Another thermal processing system currently in development by Vortek Industries LTD., of Canada, uses flash assisted spike annealing to attempt to provide a high thermal energy to the substrate in a short amount of time and then rapidly cool the region to limit the thermal exposure. Use of this thermal processing system should give the junction depth of a spike anneal to 1060° C. but improve the activation with flash to 1100° C. Typically, the RTP system ramps up to the desired temperature typically around 1060° C. and then begins to ramp down immediately after having reached the desired flash temperature. This is done to minimize the amount of diffusion that takes place while still getting suitable activation from the elevated temperature. The thermal profile 106 of such a flash assisted spike anneal is also shown in FIG. 1.

In view of the above, there is a need for an apparatus and method for annealing a substrate with high ramp-up and ramp-down rates. This will offer greater control over the fabrication of smaller devices leading to increased performance. Furthermore, such an apparatus and method should ensure that every point of the substrate has a substantially homogenous thermal exposure, thereby reducing pattern dependencies and potential defects.

We now turn our attention to layering, which is another basic fabrication operation that typically requires the addition of energy or heat. Layering adds thin layers or films to a substrate's surface using a variety of techniques, of which the most widely used are growing and deposition. The added layers function in the IC devices as semiconductors, dielectrics (insulators), or conductors. These layers must meet various requirements, such as uniform thickness, smooth and flat surfaces, uniform composition and grain size, stress-free films, purity, and integrity. Common deposition techniques that require the addition of energy are: chemical vapor deposition (CVD); a variation of CVD known as rapid thermal chemical vapor deposition (RTCVD); another variation of CVD known as low pressure CVD (LPCVD); and atomic layer deposition (ALD), to name but a few.

CVD is the most widely used technique for physically depositing one or more layers or films, such as silicon nitride ($Si_3N_4$), on a substrate surface. During the CVD process, various gases, such as ammonia ($NH_3$) and dichlorosilane (DCS), containing the atoms or molecules required in the final film, are injected into a reaction chamber. Chemical reactions between the gases are induced with high energy such as heat, light, or plasma. The reacted atoms or molecules deposit on the substrate surface and build up to form a thin film having a predetermined thickness. The deposition rate can be manipulated by controlling the reaction condition of supplied energy; the amount and ratio of gases present in the reaction chamber; and/or the pressure within the reaction chamber.

The reaction energy is typically supplied by heat (either conduction or convection), induction RF, radiant, plasma, or ultraviolet energy sources. Temperatures typically range from room temperature to 1250° C., and more typically from 250° C. to 850° C.

Although it is desirable in current CVD thermally driven processes to heat the substrate to a high temperature, it is also desirable that the substrate is not exposed to these high temperatures for too long. However, current thermally driven processes heat the entire substrate, despite the fact that only the surface of the substrate needs to be heated. Heating the entire substrate limits how fast one can heat up and cool down the substrate, as the substrate has a thermal inertia that resists changes in temperature.

Furthermore, in CVD and LPCVD, various gases are supplied or injected into the reaction chamber at the same time. A gas phase reaction occurring between the reactant gases may, however, occur at any location within the reaction chamber, including the ambient space around the substrate. Reactions occurring in the ambient space are undesirable as they can form particles which can become imbedded in the film formed on the substrate.

More recently, ALD was developed to address the above described gas phase reaction problems with CVD and LPCVD. In ALD, the first and second gases are not present in the reaction chamber at the same time, therefore, the gas phase reaction does not occur in the ambient space. This eliminates the problems associated with particle formation in the ambient space. However deposition rates for ALD are slow, taking approximately 1 Angstrom per second. Also, ALD is bound by the same temperature constraints and thermal budget issues as CVD.

In light of the above, there is a need for an apparatus and method for depositing layers on a substrate that reduces gas phase reaction problems. More specifically, such an apparatus and method, should only heat the surface of the substrate and provide high ramp-up and ramp-down rates, i.e., low thermal budget. Such an apparatus and method preferably meet general and specific parameters, such as uniform layer thickness, smooth and flat layer surfaces, uniform layer composition and grain size, low stress films, purity, and integrity.

SUMMARY OF THE INVENTION

According to an embodiment of the invention there is provided an apparatus for depositing layers on a substrate. The apparatus includes a reaction chamber and a gas injector to inject at least one gas into the reaction chamber. The apparatus also includes a continuous wave electromagnetic radiation source, a stage within the reaction chamber, and focusing optics disposed between the continuous wave electromagnetic radiation source and the stage. The stage is configured to receive a substrate thereon. The focusing optics are configured to focus continuous wave electromagnetic radiation from the continuous wave electromagnetic radiation source into a line of continuous wave electromagnetic radiation on an upper surface of the substrate. The line of continuous wave electromagnetic radiation preferably extends across the width or diameter of the substrate. The apparatus further includes a translation mechanism configured to translate the stage and the line of continuous wave electromagnetic radiation relative to one another.

Further according to the invention there is provided a method for depositing one or more layers on a substrate. The substrate is initially positioned in the reaction chamber. One or more gases are introduced into the reaction chamber. A predetermined speed for translating a line of radiation is determined. This predetermined speed is based on a number of factors, such as a thermal recipe for processing the substrate, the properties of the substrate, a power of the continuous wave electromagnetic radiation, a width of the line of radiation, a power density at the line of radiation, or the like.

Continuous wave electromagnetic radiation is then emitted from a continuous wave radiation source and preferably collimated. The continuous wave electromagnetic radiation is subsequently focused into a line of radiation extending across the surface of the substrate. The line of radiation is then translated relative to the surface at the constant predetermined speed.

The combination of the introduced gas(s) and heat generated by the line of radiation causes at least one gas to react and deposit a layer on the surface of the substrate. Undesirable byproducts of the reaction are then flushed from the reaction chamber. This process is repeated until a layer having a predetermined thickness is formed on the surface of the substrate.

According to another embodiment of the invention there is provided a thermal flux processing device. The thermal flux processing device includes a continuous wave electromagnetic radiation source, a stage, focusing optics, and a translation mechanism. The continuous wave electromagnetic radiation source is preferably one or more laser diodes. The stage is configured to receive a substrate thereon. The focusing optics are preferably disposed between the continuous wave electromagnetic radiation source and the stage and are configured to focus continuous wave electromagnetic radiation from the continuous wave electromagnetic radiation source into a line of continuous wave electromagnetic radiation on an upper surface of the substrate. A length of the line of continuous wave electromagnetic radiation preferably extends across an entire width of the substrate. The translation mechanism is configured to translate the stage and the line of continuous wave electromagnetic radiation relative to one another, and preferably includes a chuck for securely grasping the substrate.

Still further, there is provided a method for thermally processing a substrate. Continuous wave radiation is focused into a line of radiation at an upper surface of the substrate. The line of radiation is translated relative to the surface at a constant predetermined speed. This allows for every point of the substrate to have a substantially homogenous thermal exposure or history. Process control is achieved by modulating scan speed rather than lamp power, thereby simplifying the control of the apparatus. This allows for highly local heating without generating defects.

Therefore, the present invention beats only a small portion of the surface of the substrate at any given moment. This reduces the total radiated power requirement. In fact, an energy density of 150 kW/cm$^2$ is achievable on a 300 mm substrate with only a 5 kW radiation source, as only one chord of the substrate is heated at any one time.

By heating a small area at any given moment, it is possible to achieve millions of degrees per second ramp rates on a substrate with only a few kilowatts of radiated power. Additionally, ramp rates this high allow for the upper surface to be heated from ambient temperature to 1200° C. or higher and cooled back down to nearly ambient temperature before the bulk substrate temperature can rise.

The above described apparatus and method can heat the substrate surface to any reasonable temperature for a millisecond or less. In addition, as the line of radiation only applies heat to the surface of the substrate, the reaction of the gases only occurs at the surface. Where the reactions at room temperature are negligible, this allows multiple gases to be injected simultaneously without leading to undesirable gas phase reactions away from the substrate surface. This method can be performed at atmospheric pressure, resulting in faster decomposition of reactants, thereby enabling high deposition rates.

According to another embodiment of the invention, a thermal processing that includes a stage, a continuous wave electromagnetic radiation source, a series of lenses, a translation mechanism, a detection module and a computer system. The stage is configured to receive a substrate thereon. The continuous wave electromagnetic radiation source is disposed adjacent the stage, and is configured to emit continuous wave electromagnetic radiation along a path toward the substrate. The series of lenses is disposed between the continuous wave electromagnetic radiation source and the stage. The series of lenses are configured to condense the continuous wave electromagnetic radiation into a line of continuous wave electromagnetic radiation on a surface of the substrate. Condensing causes the radiation to converge or concentrate on or toward the line of continuous wave electromagnetic radiation. The translation mechanism is configured to translate the stage and the line of continuous wave electromagnetic radiation relative to one another. The detection module is positioned within the path, and is configured to detect continuous wave electromagnetic radiation. In a preferred embodiment, the detection module is positioned between the series of lenses, more preferably between the expander lens and the remainder of the lenses that are configured to condense the continuous wave electromagnetic radiation. The computer system is coupled to the detection module. Also in a preferred embodiment, the line of continuous wave electromagnetic radiation is no wider than 500 microns and has a power density of at least 30 kW/cm$^2$.

The detection module preferably comprises at least one emitted power detector configured to detect emitted continuous wave electromagnetic radiation emitted from the continuous wave electromagnetic radiation source. The detection module also preferably comprises at least one reflected power detector configured to detect reflected continuous wave electromagnetic radiation reflected from the surface. At least one beam splitter is provided for sampling a portion of the emitted continuous wave electromagnetic radiation module and the stage, and more preferably between the series of lenses, more preferably between the expander lens and the remainder of the lenses that are configured to condense the continuous wave electromagnetic radiation. In one embodiment, the emitted power detector and the reflected power detector detect continuous wave electromagnetic radiation at 810 nm. At least one temperature detector is configured to detect the temperature of the surface at the line of continuous wave electromagnetic radiation by detecting continuous wave electromagnetic radiation at a wavelength other than 810 nm. A filter is preferably disposed between the temperature detector and the line of continuous wave electromagnetic radiation. The filter is configured to allow only continuous wave electromagnetic radiation having a wavelength other than 810 nm to reach the temperature detector. The filter is configured to allow optical pyrometer operation between 900 nm and 2000 nm, and particularly at 1500 nm.

The computer system preferably includes procedures for determining emitted power that is emitted to the emitted power detector; procedures for determining reflected power that is reflected to the reflected power detector; and procedures for controlling power supplied to the continuous wave electromagnetic radiation source based on the detected, emitted, and/or reflected power. The computer system may also include reflectivity procedures for determining reflectivity. Reflectivity is proportional to the reflected power divided by the emitted power. The computer system may also include temperature procedures for determining a temperature of the surface at the line of continuous wave radiation. The temperature is proportional to an adsorbed power which equals the emitted power less the reflected power.

The series of lenses preferably include at least one expander lens disposed between the continuous wave electromagnetic radiation source and the stage. The at least one expander lens is configured to expand a beam of continuous wave electromagnetic radiation emitted from the continuous wave electromagnetic radiation source into an expanded beam of continuous wave electromagnetic radiation. The series of lenses may further include multiple cylindrical lenses arranged in series between the continuous wave electromagnetic radiation source and the stage. The multiple cylindrical lenses are configured to focus the expanded beam of continuous wave electromagnetic radiation into a line of continuous wave electromagnetic radiation on the surface of the substrate.

The continuous wave electromagnetic radiation source comprises multiple sets of opposing laser diode modules, where each of the multiple sets of opposing laser diode modules are preferably controlled separately. Also, a separate detection module is preferably provided for each set of laser diodes.

An interleave combiner is preferably disposed between the continuous wave electromagnetic radiation source and the series of lenses. The interleave combiner preferably uses dielectric stacks for enhanced reflection at continuous wave electromagnetic radiation wavelength. A thermal emission signal from the substrate is preferably measured through the series of lenses as well as the interleave combiner at a wavelength longer than that of the continuous wave electromagnetic radiation. The interleave combiner utilizes fill ratio enhancing optics to reduce the size of the series of lenses.

An adjustment mechanism may also be provided to move the continuous wave electromagnetic radiation source and the stage towards one another. This allows the computer system to control the adjustment mechanism based on measurements taken by the detection module, in order to keep the line of continuous wave radiation in focus on the surface. In an alternative embodiment a reflective surface is provided for redirecting scattered continuous wave radiation back towards the line of continuous wave radiation.

According to another embodiment of the invention, a thermal processing method is provided. A surface of a substrate is heated with a predetermined power density for a predetermined length of time. This allows the surface of the substrate to be heated from an ambient temperature ($T_A$) to a process temperature ($T_P$), while the temperature at a predetermined depth ($T_D$) from the surface remains below the ambient temperature, plus half the process temperature less the ambient temperature ($T_D \leq T_A + (T_P - T_A)/2$). In a preferred embodiment, the predetermined power density is at least 30 kW/cm$^2$, the predetermined length of time is between 100 micro-seconds and 100 milliseconds, the ambient temperature is less than about 500° C., the process temperature is more than about 700° C., and the predetermined depth is 10 times a depth of interest, where the depth of interest is a maximum depth of device structures in silicon.

The thermal processing method may also include initially coating the surface with a thermal enhancement layer. Also, any scattered continuous wave electromagnetic radiation may be reflected back toward the line of radiation. The emitted power of the continuous wave electromagnetic radiation and the reflected power of continuous wave electromagnetic radiation reflected from the surface may be measured. The reflected power may then be compared to the emitted power. Power supplied to the continuous wave electromagnetic radiation source may be controlled based on such a comparison. Also, a separate measurement may be taken of thermal emission from the substrate at a focus of the line of continuous wave electromagnetic radiation. The temperature may be determined at the surface at the line. Also, the absorption, reflectivity, and emissivity may be determined.

Before focusing, an optimum orientation of the substrate relative to a scan direction may be chosen. The optimum orientation is determined by assuring scan direction to have a minimum overlap with principal slip planes of the substrate. Also, the substrate may be pre-heated. Pre-heating comprises of one or more pre-scans with the continuous wave electromagnetic radiation source, and is preferably performed using a hot plate.

Still further, according to the invention the series of lenses include at least one expander lens and multiple cylindrical lenses. The expander lens is disposed between the continuous wave electromagnetic radiation source and the stage. The expander lens is configured to expand the beam of continuous wave electromagnetic radiation into an expanded beam of continuous wave electromagnetic radiation. The multiple cylindrical lenses are preferably arranged in series between the at least one expander lens and the stage. The multiple cylindrical lenses are configured to focus the expanded beam of continuous wave electromagnetic radiation into a line of continuous wave electromagnetic radiation on the surface of the substrate. The at least one expander lens preferably comprises two expander lenses, while the multiple cylindrical lenses have spherical figure or aspherical figure. Some of the multiple cylindrical lenses may have spherical figure and others may not. A gas injector may be provided near the multiple lenses to circulate cooling purge gas between the multiple lenses.

Further, an automatic focusing mechanism for a thermal processing device is provided. The automatic focusing mechanism includes a continuous wave electromagnetic radiation module, a stage, at least one photo detector, a translation mechanism, an adjustment mechanism, and a controller. The continuous wave electromagnetic radiation module is configured to focus continuous wave electromagnetic radiation into a line of continuous wave electromagnetic radiation on a surface of a substrate. The stage is configured to receive a substrate thereon. The at least one photo detector is coupled to the stage. The at least one photo detector is configured to measure intensity of the continuous wave electromagnetic radiation. The translation mechanism is configured to translate the stage and the continuous wave electromagnetic radiation module relative to one another. The adjustment mechanism is coupled to the stage, and is configured to adjust the height, roll and pitch of the stage. Finally, the controller is coupled to the continuous wave electromagnetic radiation module, the at least one photo detector, the translation mechanism, and the adjustment mechanism. The at least one photo detector preferably includes three photo detectors embedded into the stage. The three photo detectors and the controller are configured to measure a pitch, roll, and height of the stage relative to the continuous wave electromagnetic radiation module.

In use, the line of continuous wave electromagnetic radiation is automatically focused on a surface of a substrate. After the automatic focusing mechanism is provided, a tooling substrate having at least one aperture there through, is positioned on the stage. The at least one aperture aligns with the at least one photo detector. The at least one aperture is then radiated with continuous wave electromagnetic radiation from the continuous wave electromagnetic radiation source. An intensity of the continuous wave electromagnetic radiation is then measured at the at least one photo detector, and a position of the stage and the continuous wave electromagnetic radiation source are adjusted relative to on another, based on the intensity.

The stage and the continuous wave electromagnetic radiation source are then translated laterally relative to one another to align another aperture in the tooling substrate with another photo detector. Another aperture is then exposed to continuous wave electromagnetic radiation from the continuous wave electromagnetic radiation source. Another intensity is then sensed of the continuous wave electromagnetic radiation at another photo detector. Finally, a position of the stage and the continuous wave electromagnetic radiation source is set relative to one another, based on the another intensity. These steps are repeated until the stage is in a predetermined position relative to the continuous wave electromagnetic radiations source.

Yet another embodiment provides a method for thermally processing a semiconductor substrate. Continuous wave electromagnetic radiation is focused into a line of continuous wave electromagnetic radiation extending partially across a surface of a semiconductor substrate. The line of continuous wave electromagnetic radiation and the surface is then translated relative to one another at a constant predetermined speed. The line of radiation is subsequently shifted along its length a distance either equal to or slightly less than its length. The line of continuous wave electromagnetic radiation and the surface is again translated relative to one another at the constant predetermined speed. This over-scanning allows every exposed point of the substrate to have a substantially homogenous thermal exposure.

BRIEF DESCRIPTION OF THE DRAWINGS

For a better understanding of the nature and objects of the invention, reference should be made to the following detailed description, taken in conjunction with the accompanying drawings, in which:

FIG. 14A is a partial sectional side view of an automated focusing mechanism;

Figure 1:
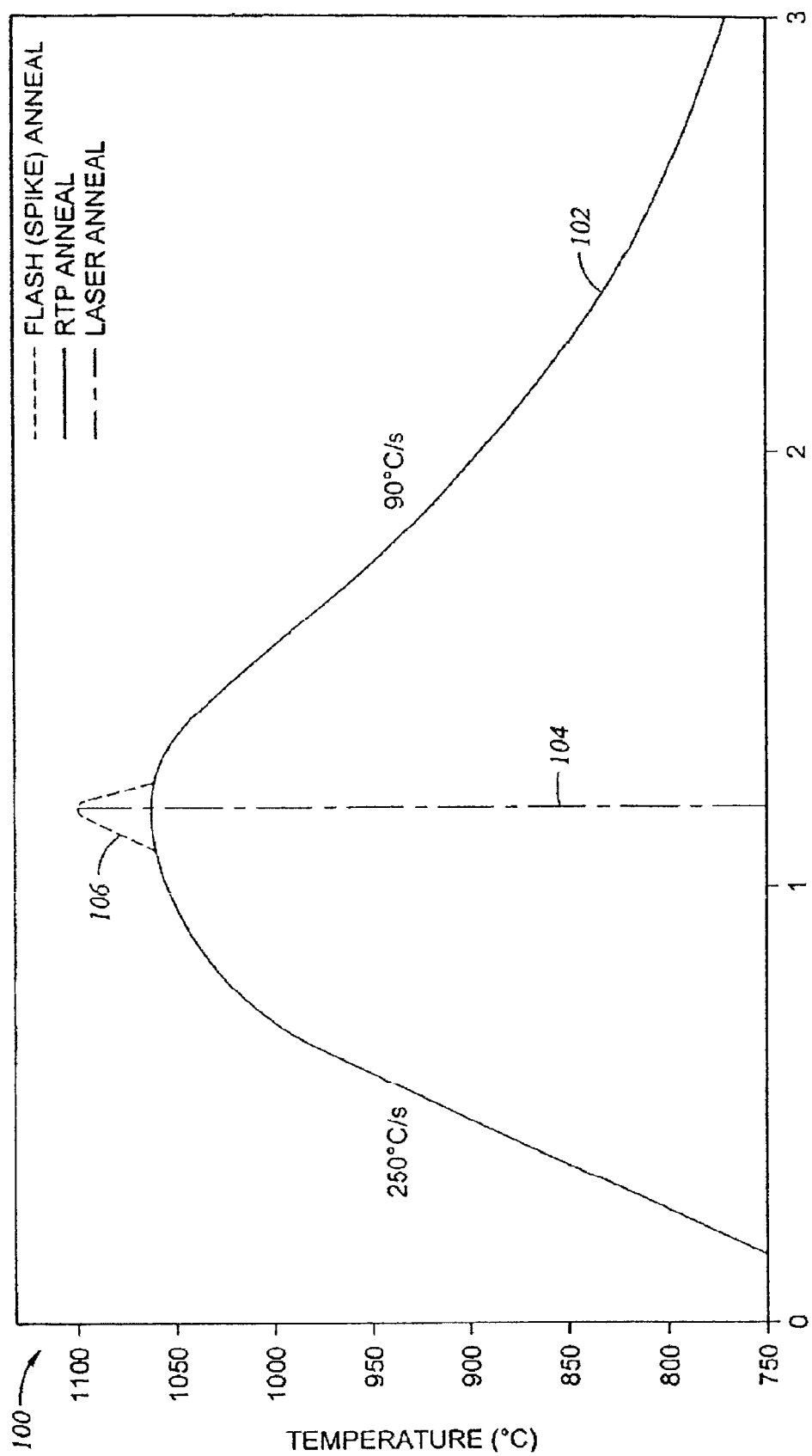
FIG. 1 is a graph of thermal profiles of different prior art thermal processes.

Like reference numerals refer to corresponding parts throughout the several views of the drawings. For ease of reference, the first number(s) of any reference numeral generally indicates the figure number in which the reference numeral was first shown. For example, 102 can be found in FIG. 1, and 1341 can be found in FIG. 13.

DETAILED DESCRIPTION OF THE INVENTION

Figure 2A:
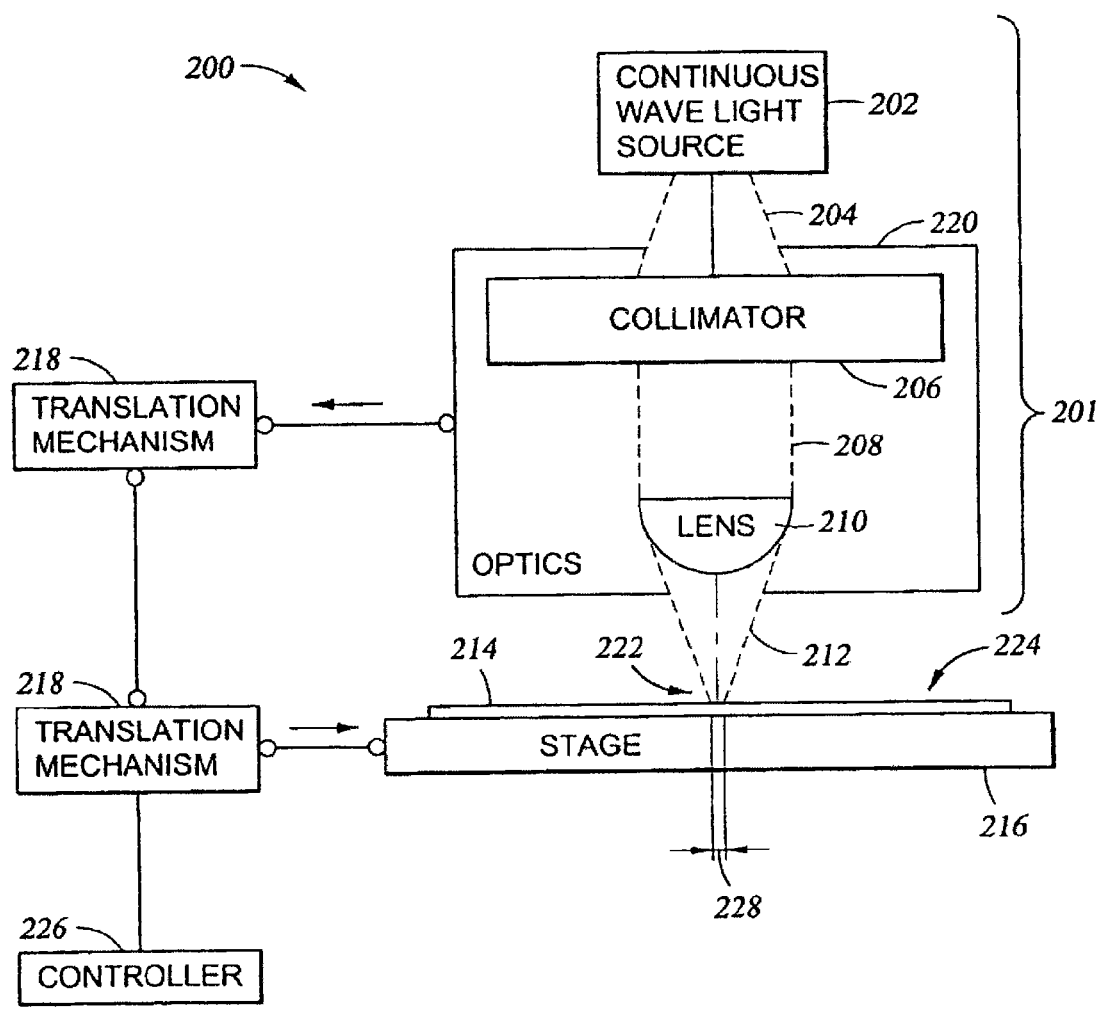
FIG. 2A is a diagrammatic side view of an apparatus for thermally processing a substrate, according to an embodiment of the invention.

FIG. 2A is a diagrammatic side view of an apparatus 200 for thermally processing a substrate, according to an embodiment of the invention. Thermally processing a substrate means conducting any thermal process that requires the characteristics of the invention described below. Exemplary embodiments of such a thermal process include thermal annealing of substrates or thermal processes used in chemical vapor deposition (CVD), both of which will be described throughout the remainder of the Figures.

The apparatus 200 comprises a continuous wave electromagnetic radiation module 201, a stage 216 configured to receive a substrate 214 thereon, and a translation mechanism 218. The continuous wave electromagnetic radiation module 201 comprises a continuous wave electromagnetic radiation source 202 and focusing optics 220 disposed between the continuous wave electromagnetic radiation source 202 and the stage 216.

In a preferred embodiment, the substrate 214 is any suitable substrate, such as a single crystal silicon substrate; silicon on insulator (SOI); Silicon Germanium or alloys thereof, glass or quartz substrate with a silicon layer thereon, as used for manufacturing thin film transistors (TFT); or the like. It will, however, be appreciated that thermal flux processing of single crystal silicon substrates is more difficult than that of TFT substrates, as single crystal silicon substrates have a much higher thermal conductivity than TFTs and the single crystal silicon substrates' applications require tighter control of the thermal process.

The continuous wave electromagnetic radiation source 202 is capable of emitting "continuous waves" or rays of electromagnetic radiation, such as light. By "continuous wave" it is meant that the radiation source is configured to emit radiation continuously, i.e., not a burst, pulse, or flash of radiation. This is quite unlike lasers used in laser annealing, which typically use a burst or flash of light.

Furthermore, as the continuous wave electromagnetic radiation needs to be absorbed at or near the surface of the substrate, the radiation has a wavelength within the range at which the substrate absorbs radiation. In the case of a silicon substrate, the continuous wave electromagnetic radiation preferably has a wavelength between 190 nm and 950 nm. More preferably, it has a wavelength of approximately 810 nm.

Alternatively, a high power continuous wave electromagnetic radiation laser source operation in or near the UV may be used. Wavelengths produced by such continuous wave electromagnetic radiation laser sources are strongly absorbed by most otherwise reflective materials.

In a preferred embodiment, the continuous wave electromagnetic radiation source 202 is capable of emitting radiation continuously for at least 15 seconds. Also, in a preferred embodiment, the continuous wave electromagnetic radiation source 202 comprises multiple laser diodes, each of which produces uniform and spatially coherent light at the same wavelength. The power of the laser diode(s) is in the range of 0.5 kW to 50 kW, but preferably approximately 5 kW. Suitable laser diodes are made by Coherent Inc. of Santa Clara, Calif. Spectra-Physics of California; or by Cutting Edge Optronics, Inc. of St. Charles, Mo. A preferred laser diode is made by Cutting Edge Optronics, although another suitable laser diode is Spectra Physics' MONSOON®. multi-bar module (MBM), which provides 40-480 watts of continuous wave power per laser diode module.

The focusing optics 220 preferably comprise one or more collimators 206 to collimate radiation 204 from the continuous wave electromagnetic radiation source 202 into a substantially parallel beam 208. This collimated radiation 208 is then focused by at least one lens 210 into a line of radiation 222 at an upper surface 224 of the substrate 214.

Lens 210 is any suitable lens, or series of lenses, capable of focusing radiation into a line. In a preferred embodiment, lens 210 is a cylindrical lens. Alternatively, lens 210 may be one or more concave lenses, convex lenses, plane mirrors, concave mirrors, convex mirrors, refractive lenses, diffractive lenses, Fresnel lenses, gradient index lenses, or the like. The focusing optics 220 is described in further detail below in relation to FIG. 11.

The stage 216 is any platform or chuck capable of securely holding the substrate 214 during translation, as explained below. In a preferred embodiment, the stage 216 includes a means for grasping the substrate, such as a frictional, gravitational, mechanical, or electrical system. Examples of suitable means for grasping include mechanical clamps, electrostatic or vacuum chucks, or the like.

The apparatus 200 also comprises a translation mechanism 218 configured to translate the stage 216 and the line of radiation 222 relative to one another. In one embodiment, the translation mechanism 218 is coupled to the stage 216 to move the stage 216 relative to the continuous wave electromagnetic radiation source 202 and/or the focusing optics 220. In another embodiment, the translation mechanism is coupled to both the continuous wave electromagnetic radiation source 202 and the focusing optics 22 to move the continuous wave electromagnetic radiation source 202 and/or the focusing optics 220 relative to the stage 216. In yet another embodiment, the translation mechanism 218 moves the continuous wave electromagnetic radiation source 202, the focusing optics 220, and the stage 216. Any suitable translation mechanism may be used, such as a conveyor system, rack and pinion system, or the like.

The translation mechanism 218 is preferably coupled to a controller 226 to control the scan speed at which the stage 216 and the line of radiation 222 move relative to one another. In addition, translation of the stage 216 and the line of radiation 222 relative to one another is preferably along a path perpendicular to the line of radiation 222 and parallel to the upper surface 224 of the substrate 214. In a preferred embodiment, the translation mechanism 218 moves at a constant speed. Preferably, this constant speed is approximately 2 cm/s for a 35 micron wide line. In another embodiment, the translation of the stage 216 and the line of radiation 222 relative to one another is not along a path perpendicular to the line of radiation 222.

Figure 2B:
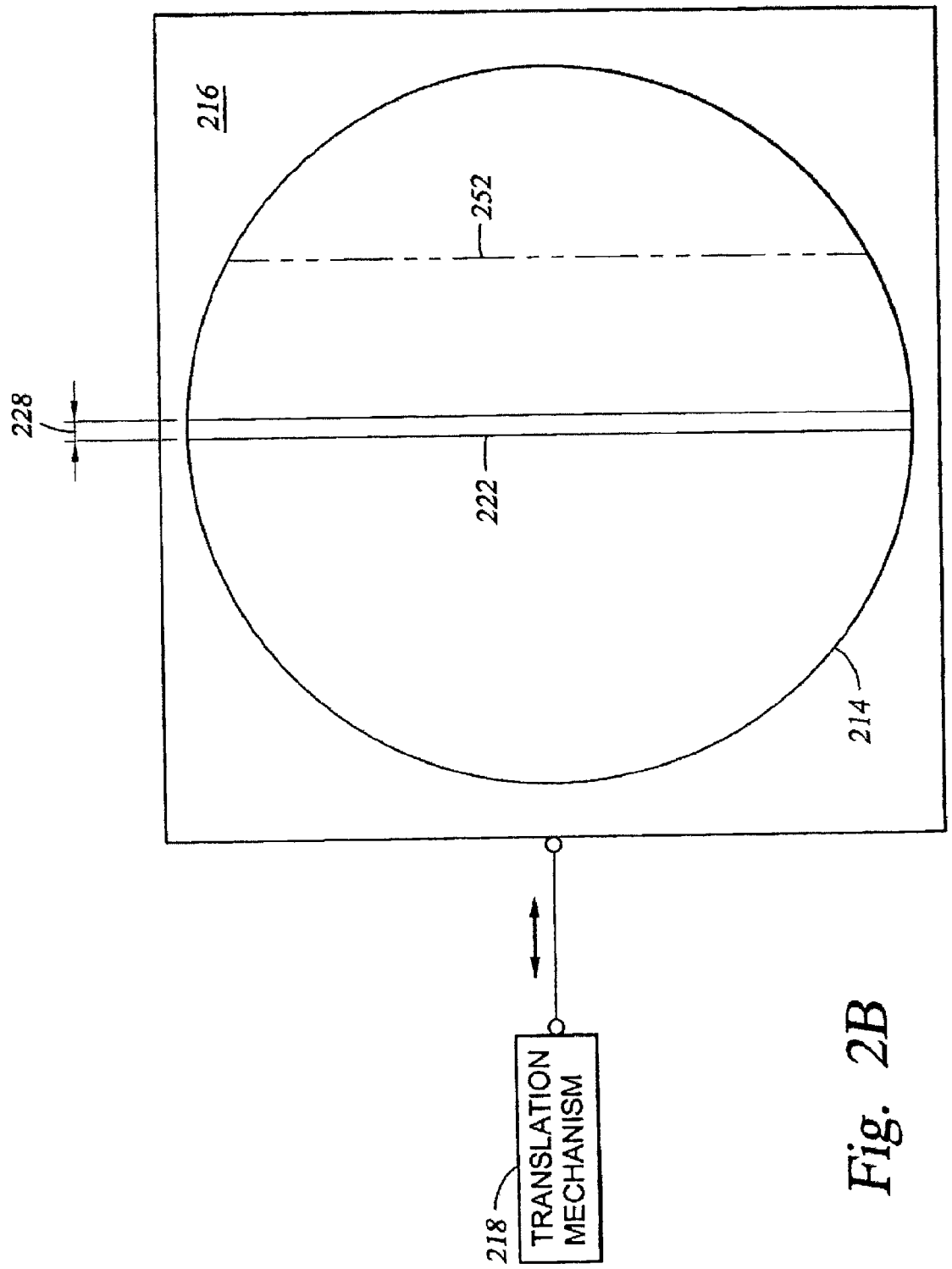
FIG. 2B is a diagrammatic top view of the substrate an stage shown in FIG. 2A.

FIG. 2B is a diagrammatic top view of the substrate and stage, as taken along line 2B-2B' of FIG. 2A. In a preferred embodiment, the substrate 214 is a circular substrate with a diameter of 200 or 300 mm, and a thickness of approximately 750 microns. The line of radiation 222 extends across the substrate 214. The line of radiation 222 also preferably has a width 228 of between 3 and 500 microns. In a preferred embodiment, the line of radiation 222 has a length that extends across the entire diameter or width of the substrate and has a width 228 of approximately 35 microns. The width is measured at half the maximum intensity of the radiation (otherwise knows as Full Width Half Max (FWHM)). In all embodiments, the length of the line is longer than its width. In a preferred embodiment, the line of radiation 222 linearly traverses the substrate 214, such that the line 222 is perpendicular to the direction of the movement, i.e., the line 222 remains parallel to a fixed line or chord 252 of the substrate that is perpendicular to the direction of the movement at all times.

A preferred power density at the line of radiation is between 10 kW/cm$^2$ and 200 kW/cm$^2$ with a nominal range near 60 kW/cm$^2$. It is not readily achievable to radiate the entire surface of a substrate at these power densities, but it is possible to scan across the substrate a line of radiation that has this intensity. For example, an experiment using a 400 microns wide line of radiation with a peak power density of 70 kW/cm$^2$ scanned at 100 cm/s, heated the surface of a substrate to approximately 1170° C. with ramp-up and ramp-down rates exceeding 4 million ° C./s.

Figure 3:
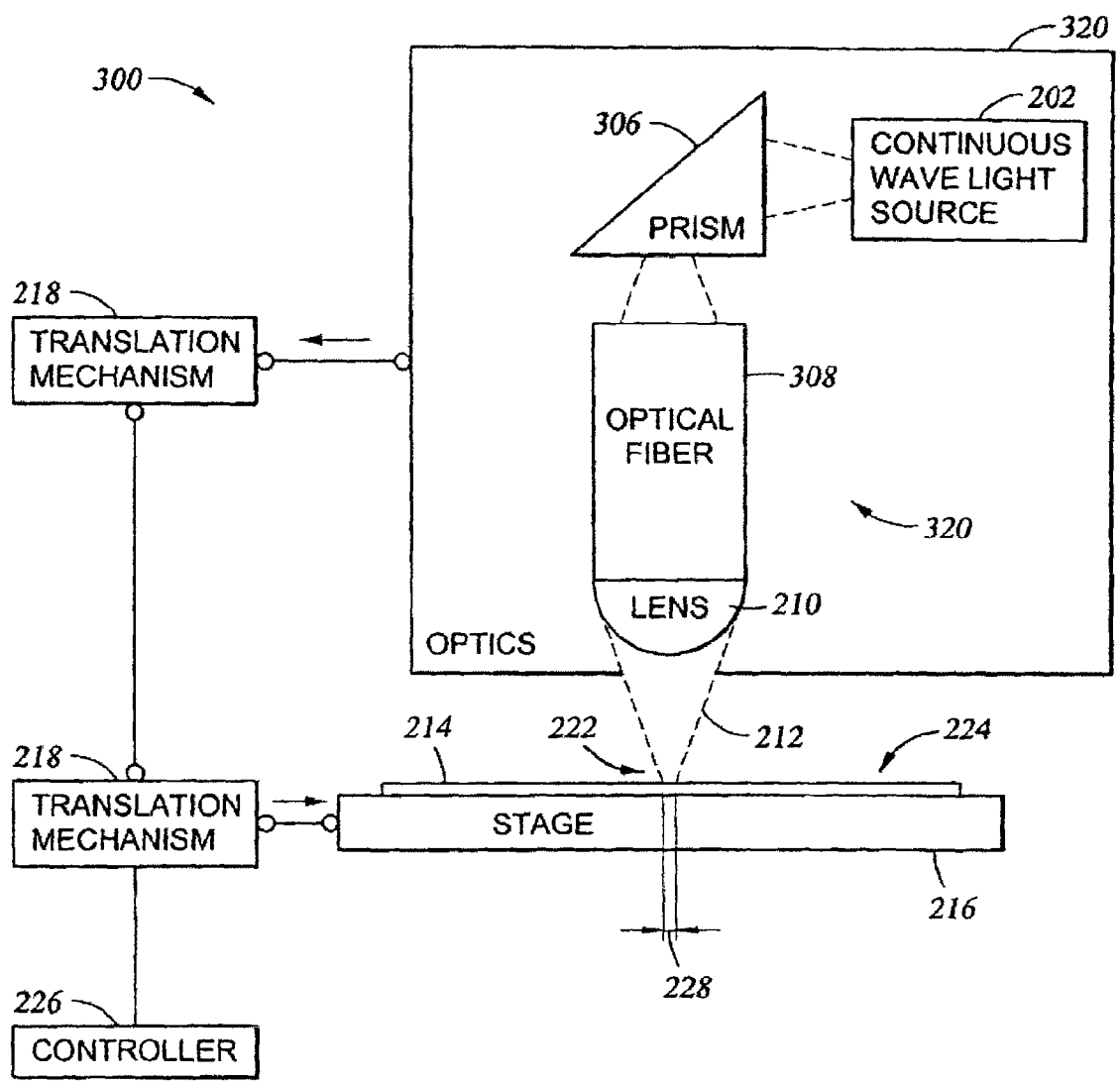
FIG. 3 is a diagrammatic side view of another apparatus for thermally processing a substrate, according to another embodiment of the invention.

FIG. 3 is a diagrammatic side view of another apparatus 300 for thermally processing a substrate, according to another embodiment of the invention. This embodiment shows another arrangement of focusing optics 320. In this embodiment, the focusing optics 320 comprise a lens 210 and one or more radiation guides, such as an optical fiber 308 and a prism 306. Other radiation guides such as a waveguide, mirror, or diffuser may also be used.

Radiation from the continuous wave electromagnetic radiation source 202 is directed at one or more prisms 306 which redirects the radiation towards one or more optical fibers 308. Radiation is transmitted through the optical fibers 308 towards the lens 210, where it is focused into a line of radiation 222.

It will be appreciated that many different combinations of the aforementioned focusing optics 220 (FIG. 2A) or 320 may be used to transmit and focus the radiation from the continuous wave electromagnetic radiation source into a line of radiation. Also, a linear array of laser diodes could be used as the radiation source 202. Any suitable means for producing a uniform radiation distribution, such as a radiation diffuser, may be used in conjunction with the radiation source 202.

Figure 4:
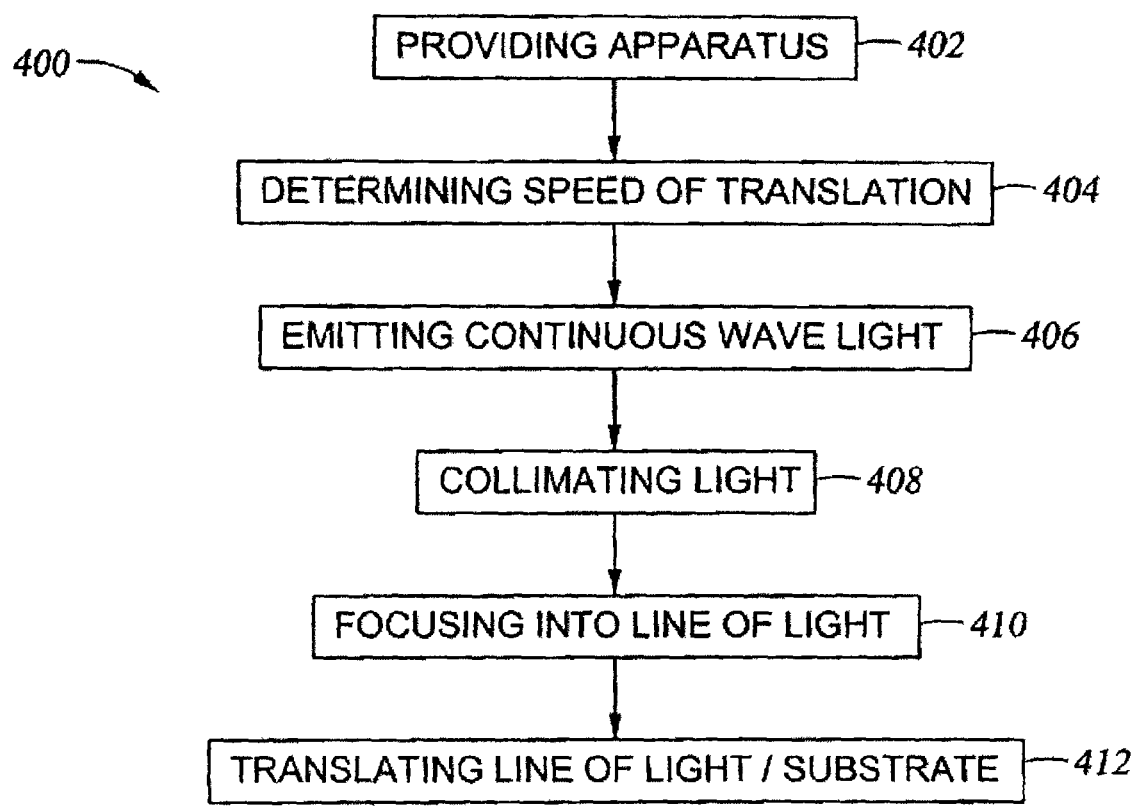
FIG. 4 is a flow chart of a method for thermally processing a substrate.

FIG. 4 is a flow chart 400 of a method for thermally processing a substrate 214 (FIG. 2A). An apparatus as described above in relation to FIGS. 2A, 2B, and 3 is provided at step 402. The controller 226 then determines, at step 404, the scan speed at which the line of radiation 222 and the substrate will move relative to one another. This determination is based on the thermal recipe for processing the substrate; the substrate properties; the power of the continuous wave electromagnetic radiation source; the width of the line of radiation; the power density at the line of radiation; or the like process characteristics.

The continuous wave electromagnetic radiation source 202 (FIG. 2A) emits a continuous wave of radiation 204, at step 406. This radiation 204 is preferably collimated into a collimated beam of radiation 208, at step 408. The collimated beam of radiation 208 is focused into a line of radiation 222, at step 410. In accordance with the predetermined scan speed, the stage 216 and the line of radiation 222 are translated, at step 412, relative to one another by the translation mechanism 218. The translation is performed along a path perpendicular to the line of radiation 222 and parallel to the upper surface of the substrate, such that the line of radiation traverses the entire substrate 214. In a preferred embodiment, the translation mechanism 218 scans the radiation source and focusing optics over the upper surface of the substrate at approximately 2 cm/s.

Figure 5:
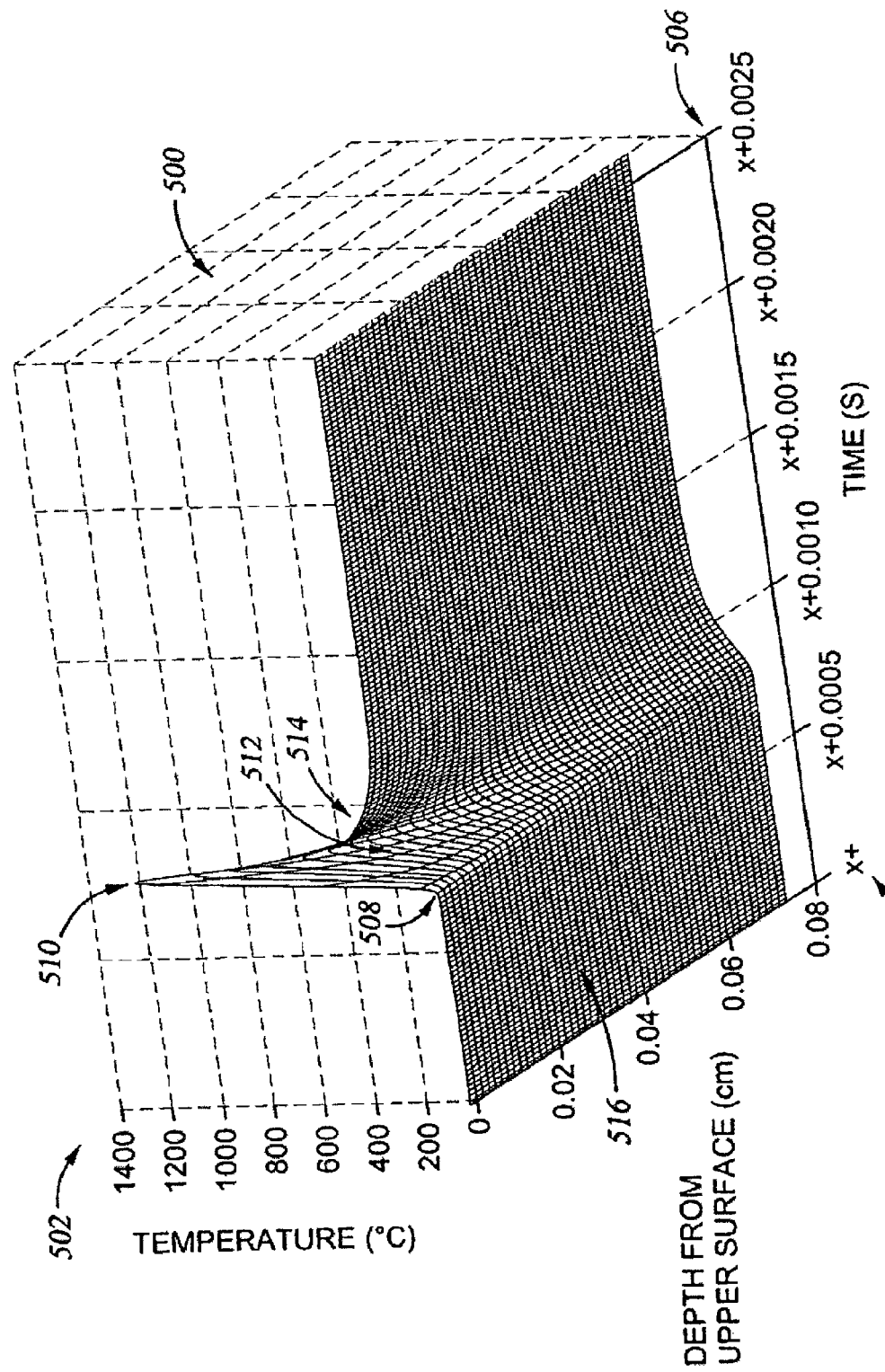
FIG. 5 is a graph of the temperature at a fixed point on and through the substrate during thermal processing, according to an embodiment of the invention.

FIG. 5 is a graph 500 of the temperature versus time and depth at a fixed point on and through the substrate during thermal processing performed according to the method described above in relation to FIG. 4. A temperature axis 502 indicates a temperature of between 0 and 1400° C. at the fixed point. Axis 504 indicates a depth from the upper surface 224 (FIG. 2B) into the substrate 214 (FIG. 2B) at the fixed point. Axis 506 indicates the time in seconds at some point after the start of scanning. The fixed point is assumed to be located at 508.

As the line of radiation 222 (FIG. 2B) scans across the upper surface 224 of the substrate 214, it subjects a line or chord on the substrate to the heat it generates. Before the line of radiation reaches the fixed point, the temperature at the fixed point, both at the upper surface 224 and throughout a substrate cross-section at the fixed point, is ambient temperature, as indicated by reference numeral 516. As soon as the line of radiation reaches the fixed point at 508, the temperature at the upper surface ramps up to a process temperature, such as 1200° C. (or other desired temperature necessary for the process), at approximately $10 \times 10^{6}$° C./s, as shown by reference numeral 510. At the same time, the substrate acts as a heat sink resulting in a dramatic drop-off in temperature away from the surface, as indicated by reference numeral 512. For example, as shown in FIG. 5, at 0.04 cm from the point on the upper surface, the temperature is approximately 200° C. Thus, the heating effect is generally localized to the upper surface only. This is extremely advantageous, as generally only the regions near the upper surface 224 of the substrate require thermal processing.

As the line of radiation passes over and away from the fixed point, the temperature drops rapidly, as shown at reference numeral 514. Again, this is because the substrate acts as a heat sink diffusing the heat at the upper surface throughout the remainder of the cooler substrate. This is not possible with prior art thermal systems, such as RTP, that simultaneously heat the entire substrate. In RTP, the entire substrate is subjected to an elevated temperature and, therefore, cannot easily dissipate the heat to a cooler region. In fact, no comparison can be made to RTP on the time scale shown in FIG. 5, because a superimposed RTP graph would yield an almost flat plane at 1100° C. extending for about one second. One second is 400 times greater than the time period illustrated in FIG. 5.

Therefore, unlike prior art processes, the current invention can heat a substrate 214 with a predetermined power density and for a short predetermined length of time (approximately 1 millisecond), such that the surface of the substrate 224 is heated from an ambient temperature ($T_A$) of preferably less than 500° C., to a process temperature ($T_P$) of preferably above 700° C. At the same time, the temperature at the predetermined depth ($T_d$) from the surface remains below the ambient temperature, plus half the process temperature less the ambient temperature, i.e., $T_D \leq T_A + (T_P - T_A)/2$. The predetermined depth is approximately ten times the depth of interest, i.e., ten times the maximum depth of device structures in Si. In a typical Si substrate, the maximum depth of the device structure is about 3 microns.

Transfer of heat to the bulk of the substrate promotes homogenous thermal exposure, as heat has enough time to diffuse from a locally strong heat absorbing region to a lower heat absorbing region. Also, pattern density effects are comparable to RTP. Advantageously, the time scale is short enough to limit the diffusion depth of the heat transfer to several microns, as opposed to the several hundred-micron thickness of the substrate in a typical RTP, thereby greatly reducing the total required power. Since the bulk of the substrate is not appreciably heated, it provides an ideal heat sink for the temperature ramp down.

One concern of prior art laser annealing systems regards stress related defects caused by rapidly heating relatively small areas of a substrate. Therefore, experimentation was undertaken to test whether the thermal flux processing of the present invention causes any stress related defects in the substrate. Peak stress occurs near the max temperature gradient, not the max temperature. If a line of radiation is suitably narrow and the depth of heating suitably shallow, it is possible to displace the region of maximum thermal gradient from the region of highest temperature, thereby increasing the slip window and decreasing defects. During this experimentation, a sample was scanned at 20 cm/s under a 400 micron wide line of radiation with a peak power density of 60 kW/cm$^2$. The present invention was able to displace the peak thermal gradient from the peak temperature, thus enabling Ultra Shallow Junction (USJ) formation suitable for the 70 nm node with a 1 keV Boron implant without introducing any dislocations. Only the typical implant related defects were observed.

Figure 6:
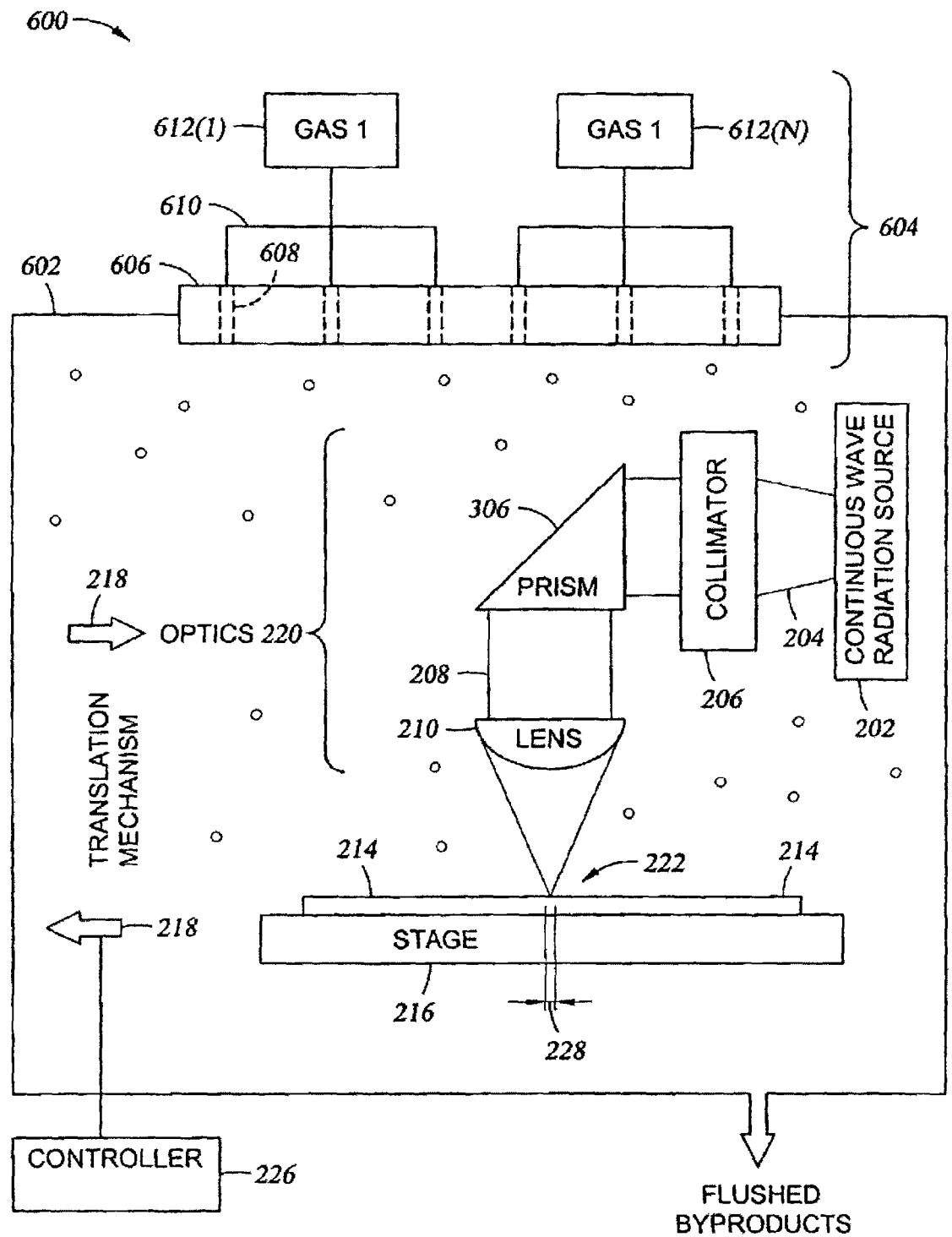
FIG. 6 is a diagrammatic side view of an apparatus for depositing layers on a substrate, according to another embodiment of the invention.

FIG. 6 is a diagrammatic side view of an apparatus 600 for depositing layers on a substrate, according to another embodiment of the invention. The apparatus 600 is similar to the apparatus 200 shown in FIGS. 2A and 2B, and apparatus 300 shown in FIG. 3. Components having the same reference numerals are the same as those shown in FIGS. 2A and 2B. The apparatus 600 may also be used to perform deposition processes, such as CVD, ALD, or the like.

In addition to the components described above in relation to FIGS. 2A, 2B and 3, apparatus 600 shows a reaction chamber 602, in which many of the components are housed. At least one injector 604 is used to introduce or inject one or more gases 616 into reaction chamber 602. The gas injector 604 preferably comprises one or more gas sources 612(1)-(N) fluidly coupled by ducts 610 to one or more gas inlets 608 in a gas manifold 606. The gas injector 604 may be located at any suitable location within the reaction chamber 602. For example, gas may be injected at the side of the reaction chamber and flow across the surface of the substrate orthogonally to the direction of relative motion between the line of radiation and the surface of the substrate, or gas may be injected from above the substrate, as shown.

In the embodiment shown in FIG. 6, continuous wave electromagnetic radiation is collimated by the collimator, redirected towards the substrate by the prism 306 and focused into a line 222 by the lens 210. It should, however, be appreciated that the focusing optics 220 may comprise any suitable focusing optics capable of focusing a line of energy onto the upper surface 224 of the substrate 214, as described above. Further, it should be appreciated that the focusing optics may be placed outside of the chamber, where radiation passes into the chamber via a transparent window. Still further, the chamber and/or gas sources may take on any suitable shape and/or configuration.

Figure 7:
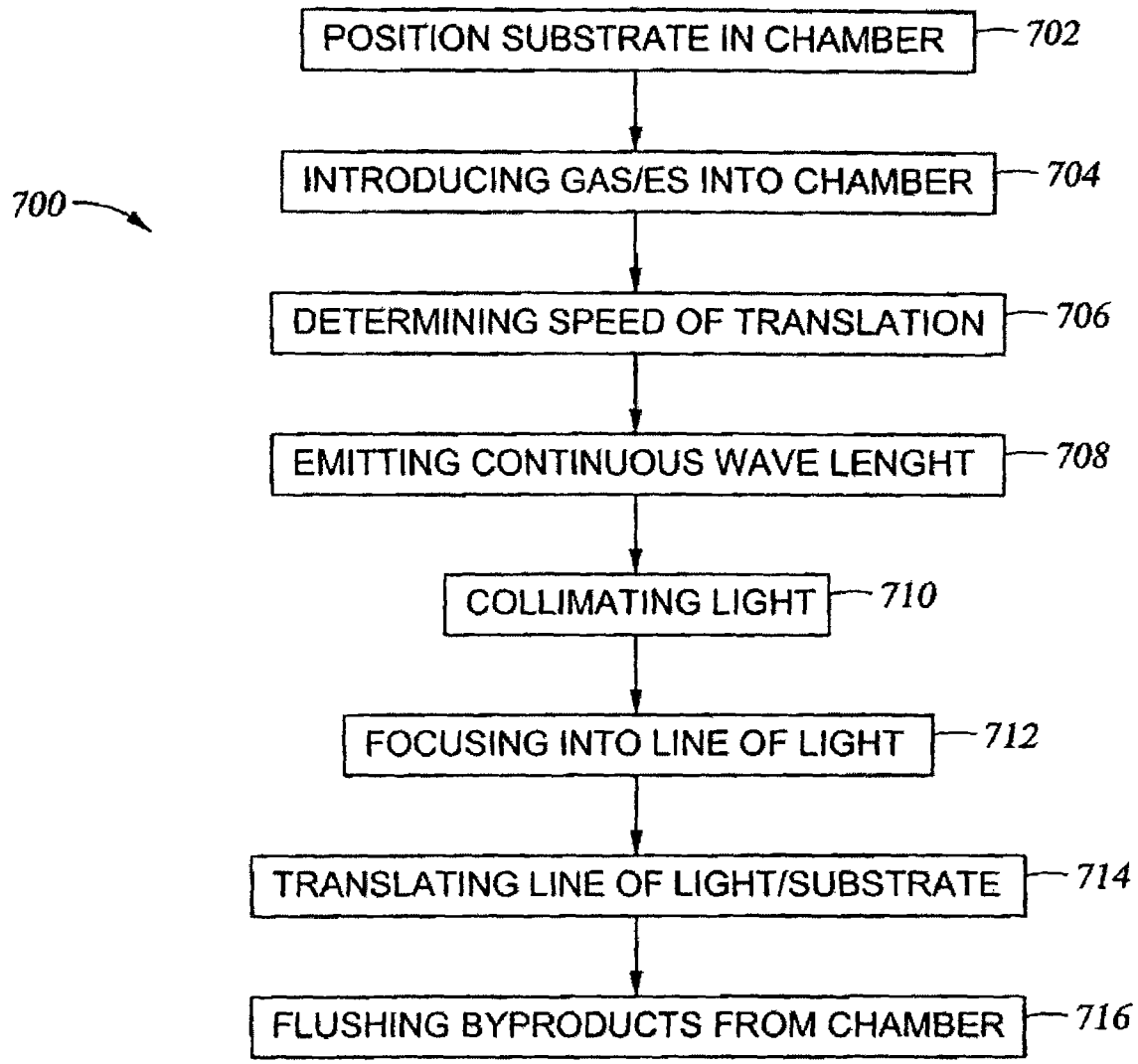
FIG. 7 is a flow chart of a method for depositing layers on a substrate, according to the embodiment of the invention shown in FIG. 6.

FIG. 7 is a flow chart 700 of a method for depositing one or more layers on a substrate, according to the embodiment of the invention shown in FIG. 6. A substrate 214 is positioned in the reaction chamber 602, at 702. One or more gases 616, such as ammonia (NH$_3$) and dichlorosilane (DCS), containing the atoms or molecules required in layer 614 are then introduced at 704 into the reaction chamber 602 containing the substrate 214.

A predetermined speed for translating a line of radiation 222, as described below, is determined at 706. This predetermined speed is based on a number of factors, such as a thermal recipe for processing the substrate, the properties of the substrate, a power of the continuous wave electromagnetic radiation, a width of the line of radiation, a power density at the line of radiation, or the like. In a preferred embodiment, this predetermined speed is approximately 2 cm/s.

Continuous wave electromagnetic radiation is then emitted at 708 from a continuous wave electromagnetic radiation source 202, as described above. The continuous wave electromagnetic radiation is preferably collimated at 710 by the collimator 206.

The continuous wave electromagnetic radiation is subsequently focused at 712 into a line of radiation 222 extending across the upper surface 224 of the substrate. In a preferred embodiment, the width 228 of the line of radiation is approximately 35 microns wide.

The line of radiation is then translated at 714 relative to the surface at the constant predetermined speed, determined above. This translation is undertaken by the translation mechanism 218 under control of the controller 226.

The combination of the introduced gas(es) 616 and heat generated by the line of radiation causes at least one gas 616 to react and deposit a layer 614 on the surface of the substrate. This reaction may be a chemical reaction between gases, a decomposition of one or more gases, or the like. Undesirable byproducts of the reaction are then flushed from the reaction chamber at 716.

The process is repeated until a layer 614 having a predetermined thickness is formed on the upper surface 224 of the substrate 214. The predetermined scan speed is preferably faster than that required for thermal flux annealing, described above, as multiple scans are required to build a film/layer. Typically, each deposited layer is between 8-10 Angstroms. Required films/layers vary from 20 Angstroms for tunnel oxide used in flash memory to 1500 Angstroms for spacer applications. Therefore, the preferred scan speed is generally in the range of a few cm/sec to about 1 m/sec. The preferred line width 228 is the same as that described above.

The chemical reaction is controlled by controlling: the temperature of the substrate surface by adjusting the continuous wave electromagnetic radiation or the line of radiation; the amount and/or ratio of the gas(s) introduced into the reaction chamber; and the pressure within the reaction chamber.

The above described method can heat the substrate surface to any reasonable temperature for a millisecond or less. In addition, as the gas right near the surface is heated by the line of radiation, the reaction of the gases only occurs at or near the surface. The heating is very brief as the line keeps moving so only the gas right near the surface gets to react. Because gas away from the surface never gets hot, undesirable gas phase reactions are prevented. This allows multiple gases to be injected simultaneously without leading to undesirable gas phase reactions away from the substrate surface.

Figure 8:
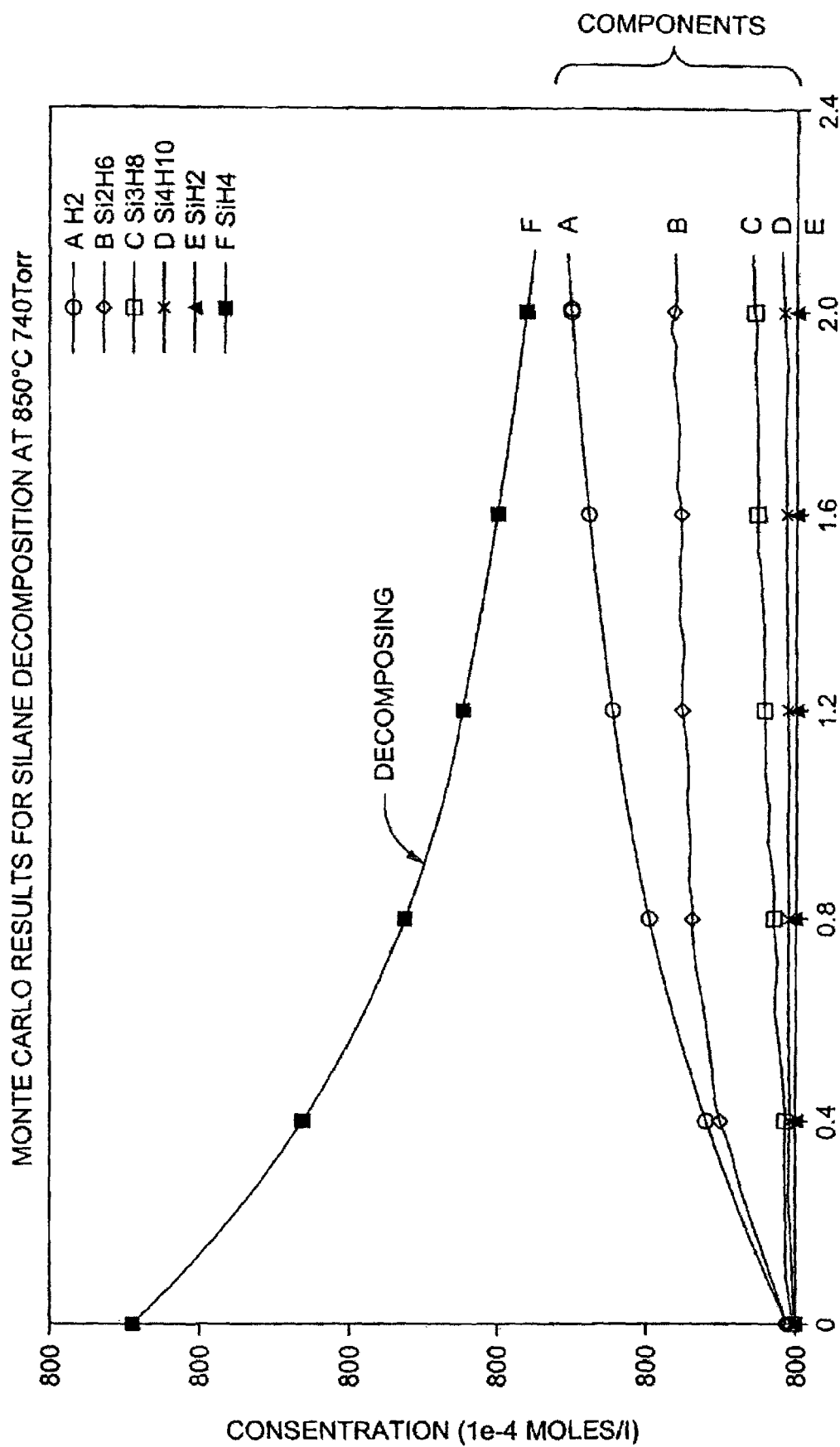
FIG. 8 is a graph of the results of a Monte Carlo simulation for silane decomposition at 850° C. and 740 Torr, according to the embodiment of the invention shown in FIG. 6.

In a preferred embodiment, the above described method is performed at a pressure of between a few Torr to pressures above atmospheric pressure, with atmospheric pressure being preferred. FIG. 8 depicts the results of a simulation showing that sufficient decomposition of reactants can occur at such pressures on this short time scale. Also, in a preferred embodiment, the temperature of the line of radiation depends on the film/layer being deposited, but is generally in the range of 600 to 900° C.

FIG. 8 is a graph 800 of the results of a Monte Carlo simulation for silane decomposition at 850° C. and 740 Torr, according to the embodiment of the invention shown in FIG. 6. This simulation at lower pressures duplicates a deterministic model published by Meyerson, Scott and Tsui, Chemtronics 1 (1986) 150, which is hereby incorporated by reference.

This graph 800 shows that a silane, such as dichlorosilane (DCS), which is a typical CVD gas, decomposes into molecules required for deposition onto the substrate surface. Decomposition occurs at 740 Torr, which is approximately atmospheric pressure, and at a temperature of 850° C. The overall time in which decomposition occurs at this temperature and pressure is approximately $6 \times 10^{-4}$ seconds. This temperature and scan speed can only be provided by the present invention, as prior art methods cannot achieve such a high temperature in such a short amount of time, while providing enough time for reactions to occur.

The above described apparatus and method for depositing a layer on a substrate has a number of advantages. For example, the thermal budget of the process is low due to the brief time spent at elevated temperature.

In addition, as the line of radiation only applies heat to the surface of the substrate, the reaction of the gases only occurs at the surface. This leads to a reduction in gas phase transport limitations. This also leads to a reduction in gas phase reactions away from the surface, thereby avoiding undesirable particle formation on the substrate surface. In addition, this method can be performed at atmospheric pressure, resulting in faster decomposition of reactants, such as Silane, thereby enabling high deposition rates.

Figure 9A:
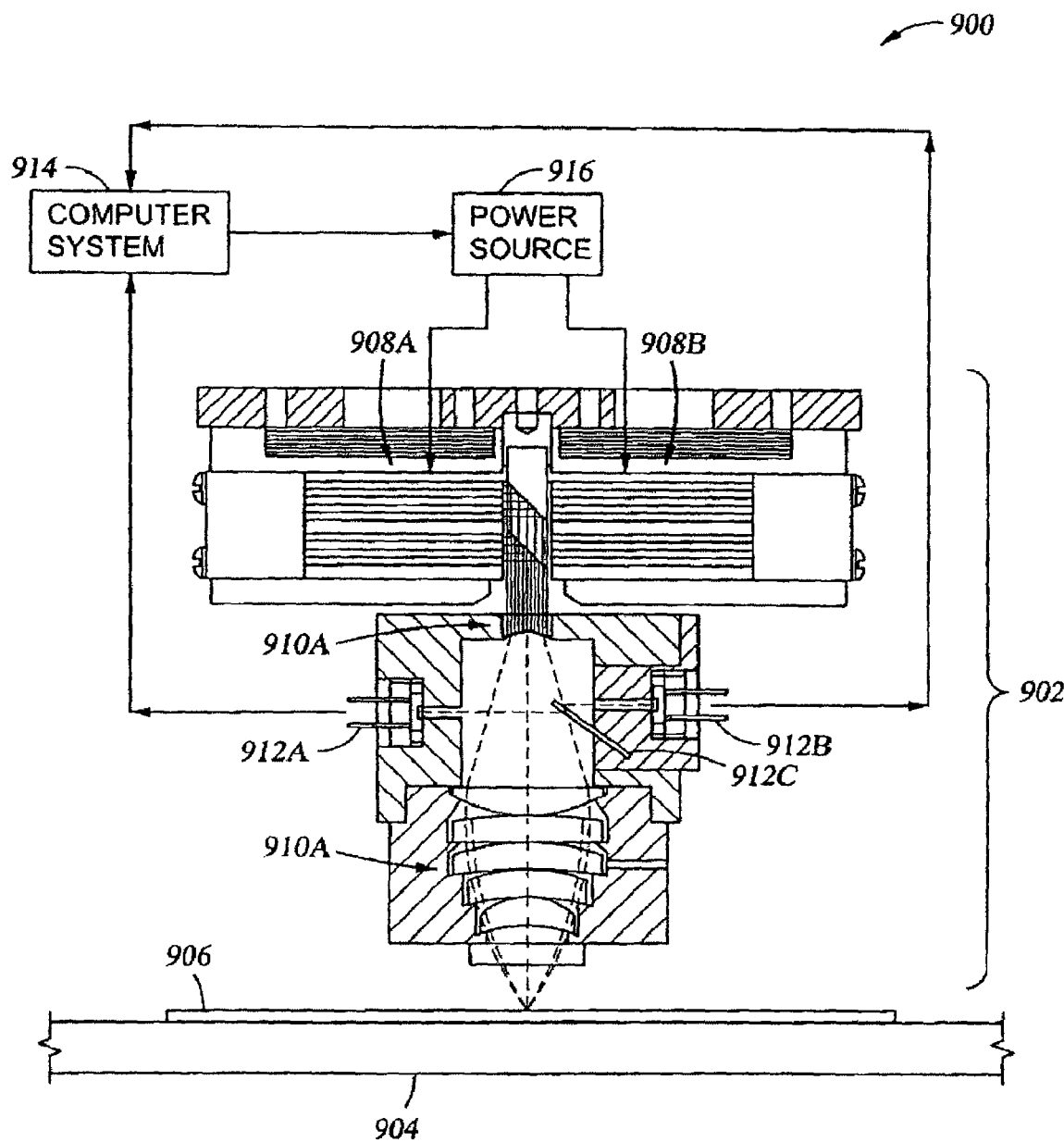
FIG. 9A is a side view of yet another apparatus for thermally processing a substrate, according to yet another embodiment of the invention.

FIG. 9A is a side view of yet another apparatus 900 for thermally processing a substrate, according to yet another embodiment of the invention. The apparatus 900 is similar to the apparatus 200 shown in FIGS. 2A and 2B, the apparatus 300 shown in FIG. 3, and the apparatus 600 shown in FIG. 6. Like-named components are similar, except for any differences described below.

The apparatus 900 comprises a continuous wave electromagnetic radiation module 902, a stage 904 configured to receive a substrate 906 thereon, and a translation mechanism (not shown) for moving the stage 904 and continuous wave electromagnetic radiation module 902 relative to one another. The continuous wave electromagnetic radiation module 902 preferably includes at least one continuous wave electromagnetic radiation source 908(A+B) and optics 910(A+B) disposed between the continuous wave electromagnetic radiation source 908(A+B) and the substrate 906. As described above, the substrate 906 is any suitable substrate, such as a single crystal silicon substrate; silicon on insulator (SOI); Silicon Germanium or alloys thereof; glass or quartz substrate with a silicon layer thereon, as used for manufacturing thin film transistors (TFT); or the like.

Figure 9B:
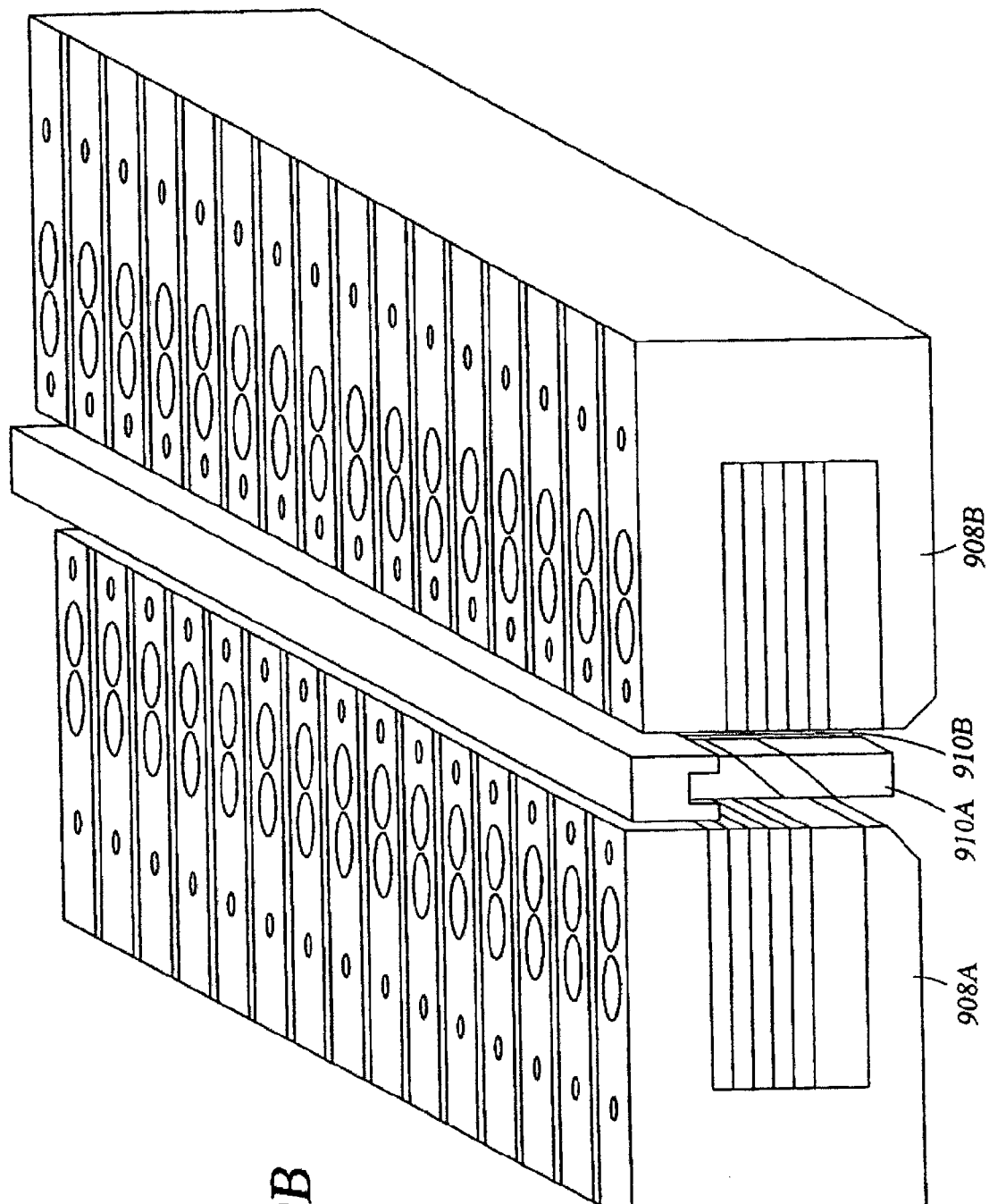
FIG. 9B is an oblique view of the apparatus shown in FIG. 9A.

The continuous wave electromagnetic radiation source 908(A+B) is similar to the continuous wave electromagnetic radiations source 202 described above in relation to FIG. 2A. In a preferred embodiment, the continuous wave electromagnetic radiation source 908(A+B) provides up to 9 kW of radiation focused by the optics 910(A+B) into a line of radiation on the surface of the substrate that is 30 microns wide and at least 300 mm long. Also, in a preferred embodiment, the continuous wave electromagnetic radiation source 908(A+B) includes 15 laser diode modules 908(A) on one side of the apparatus 900 and 16 laser diode modules 908(B) on the other side of the apparatus 900. The laser diode modules 908(A) are staggered in relation to the laser diode modules 908(B), as illustrated in FIG. 9B, i.e., radiation emitted from the laser diode modules 908(A) interdigitate radiation emitted from the laser diode modules 908(B). Also, in a preferred embodiment, each set of opposing laser diode modules is electrically coupled to one or more power sources 916. Alternatively, each single laser diode module, or combinations of laser diode modules, may be powered by one or more power sources. The power source(s) 916 are electrically coupled to a computer system 914.

In a preferred embodiment, a cooling fluid, such as water, is circulated within the continuous wave electromagnetic radiation source 908(A+B) to keep it cool, as is well understood in the art.

The optics 910(A+B) include focusing optics 910(A) similar to the focusing optics described above, and an interleave combiner 910(B). The interleave combiner 910(B) is described below in relation to FIG. 10, while the focusing optics 910(A) are described below in relation to FIG. 11

The apparatus 900 also preferably includes a detection module 912(A+B+C) coupled to the computer system 914, as described below in relation to FIG. 11.

The computer system 914 includes instructions and/or procedures for performing the method described below in relation to FIG. 13.

Figure 9C:
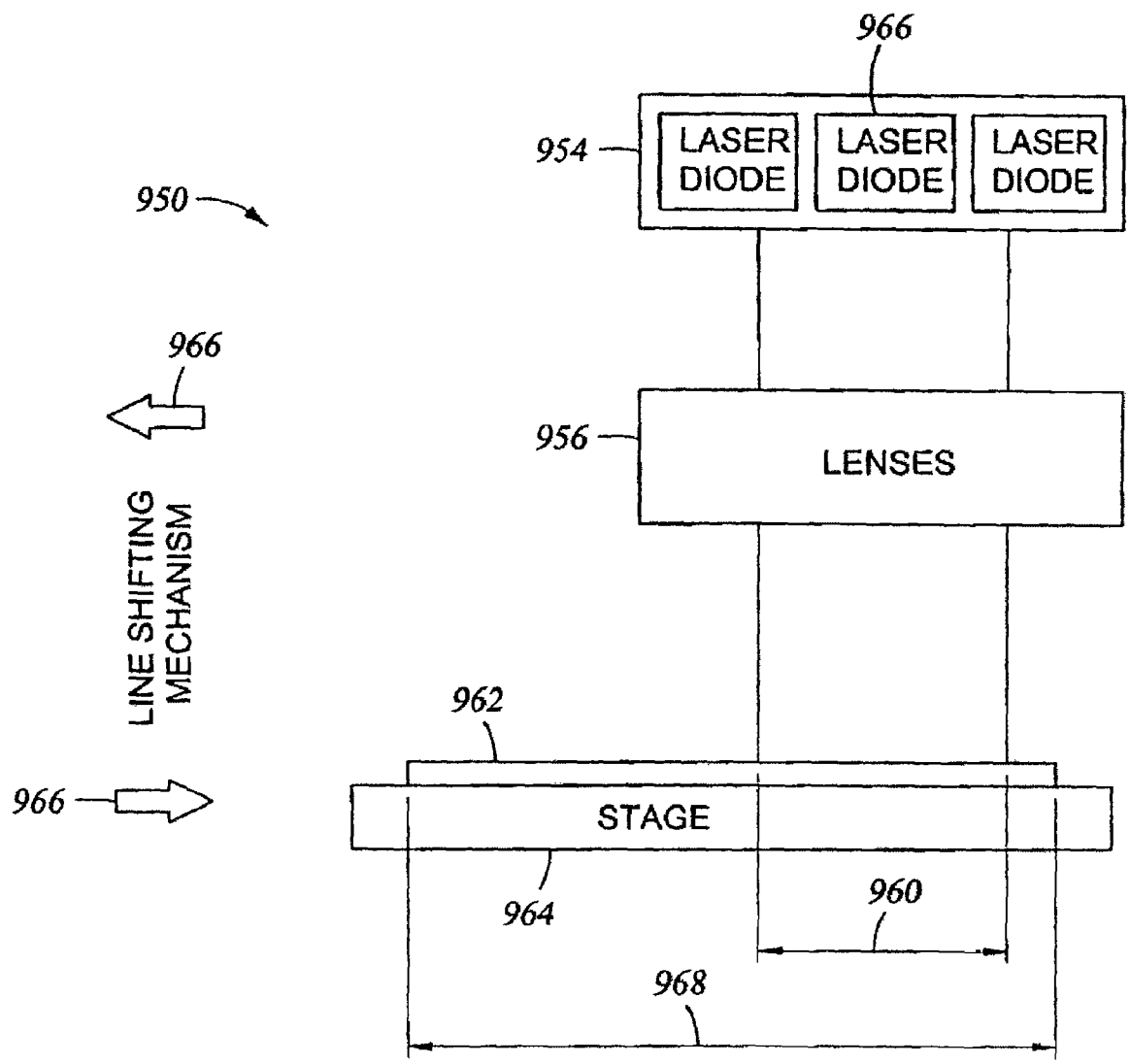
FIG. 9C is a rear view of yet another apparatus for thermally processing a substrate, according to yet another embodiment of the invention.

FIG. 9C is a rear view of yet another apparatus 950 for thermally processing a substrate 962, according to yet another embodiment of the invention. In this embodiment, the line of continuous wave electromagnetic radiation does not extend across the entire width of the substrate 962, but rather only partially extends across the diameter or width of the substrate. In other words, the line of continuous wave electromagnetic radiation has a length 960, which is less than the diameter or width 968 of the substrate 962.

In use, the line of continuous wave electromagnetic radiation preferably makes more than one scan across the substrate surface. Each successive scan preferably overlaps a previously scanned area, such that thermal exposure uniformity along the length of the line is improved. A line shifting mechanism 966 is used to shift the line of continuous wave electromagnetic radiation and the substrate relative to one another along the length of the line, i.e., substantially collinear with the length of the line and substantially perpendicular to the scan direction. This overlap averages the thermal exposure of all points on the substrate in a similar manner to rotary averaging using in RTP.

To translate the line of continuous electromagnetic radiation relative to the substrate, the line shifting mechanism 966 preferably translates the continuous wave electromagnetic radiation module (radiation source 954 and the lenses 956). Alternatively, the stage 964 may be translated relative to the line, or both the line and the stage may be translated relative to each other.

Such an embodiment requires fewer laser diode modules 966, as the length 960 of the line of continuous wave electromagnetic radiation needs only span partially across the diameter or width of the substrate 962. For example, two laser diode modules may be interleaved between three opposing laser diode modules 966.

Figure 10:
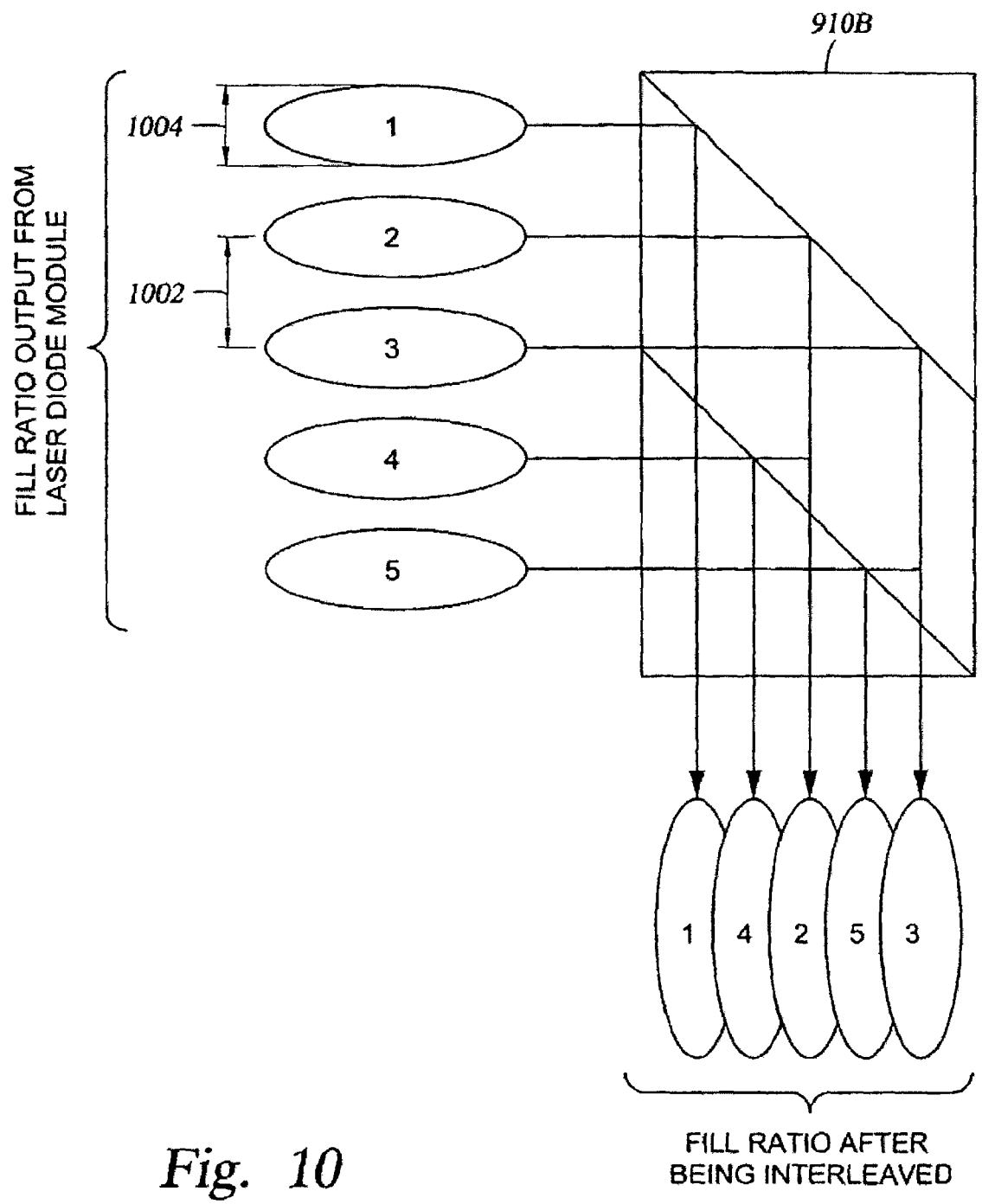
FIG. 10 is a diagrammatic side view of the interleave combiner shown in FIGS. 9A and 9B.

FIG. 10 is a diagrammatic side view of the interleave combiner 910(B) shown in FIGS. 9A and 9B. The interleave combiner 910(B) forms part of the optics 910(A+B) and is used to improve the fill ratio of the emitted continuous wave electromagnetic radiation, as explained below. In a preferred embodiment, the interleave combiner 910(B) is an interleaving prism assembly.

In addition, a preferred embodiment of the apparatus 900 (FIGS. 9A and 9B) includes micro lenses (not shown) to collimate the fast axis output of each laser diode module 908(A) or 908(B). In this preferred embodiment, the pitch 1002 of each laser diode module is 2.2 mm, while the aperture 1004 of the fast axis collimating micro lens is 0.9 mm. A fill ratio is the area exposed to continuous wave electromagnetic radiation divided by the total area of the continuous wave electromagnetic radiation module. Therefore, for example, if the lens system provides a beam footprint 1 cm long by 900 microns wide, and the pitch of each laser diode module is 2.2 mm, then the fill ratio is 900 microns/2.2 mm or 41%, i.e., only 41% of the emitting area of the continuous wave electromagnetic radiation module is actually emitting continuous wave electromagnetic radiation, while 59% of the space or area on the face of the laser module remains dark. The dark areas are 1 cm long by 1.3 mm (2.2-0.9) wide. This leads to substantially empty areas where no continuous wave electromagnetic radiation is present.

In order to improve optical performance, the fill ratio is preferably increased by the interleave combiner 910(B), thereby requiring a smaller subsequent series of lenses 910(A) (FIGS. 9A and 9B). In a preferred embodiment, the interleave combiner 910(B) doubles the fill ratio. For example continuous wave electromagnetic radiation outputs from the 4th and 5th laser diode modules are interleaved in between continuous wave electromagnetic radiation emitted from the 2nd and 3rd laser diode modules, as shown in FIG. 10. Accordingly, the total power output is that of five laser diode bars compressed into the space of three laser diode bars. This makes subsequent beam expansion and focusing easier so that suitably high power densities can be achieved.

In a preferred embodiment, the interleave combiner 910(B) uses multi-layer dielectric mirrors on a suitable optical glass, such as BK7 or fused silica, for enhanced reflection at continuous wave electromagnetic radiation wavelength.

Figure 11:
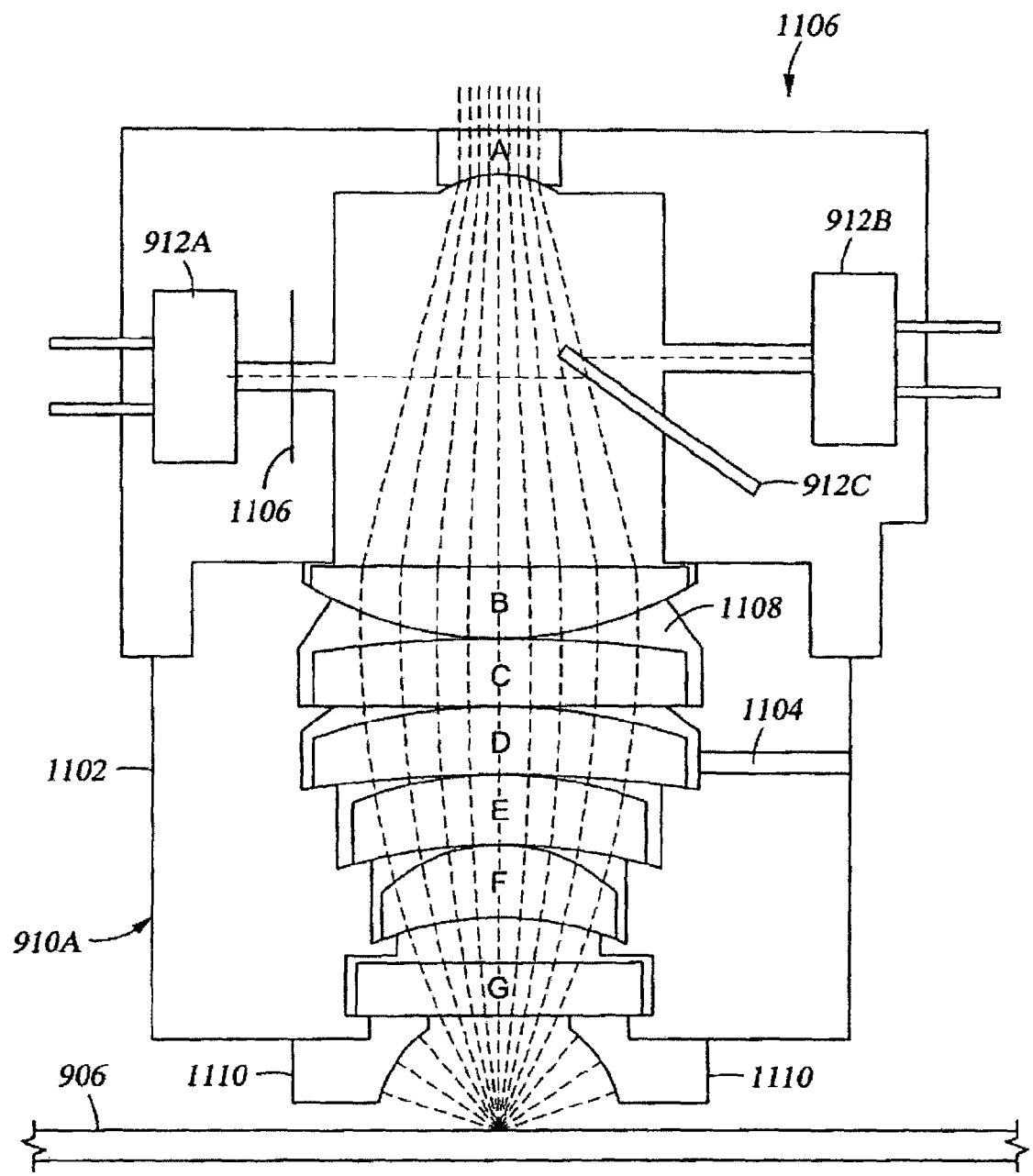
FIG. 11 is a more detailed sectional side view of the focusing optics and the detection module shown in FIGS. 9A and 9B.

FIG. 11 is a more detailed sectional side view of the focusing optics 910(A) and the detection module 912(A+B+C). The purpose of the focusing optics 910(A) is to focus continuous wave electromagnetic radiation emitted from the continuous wave electromagnetic radiation source 908(A+B) (FIGS. 9A and 9B) into a line of continuous wave radiation on the surface of the substrate 906. In a preferred embodiment, the focusing optics 910(A) includes a series of seven lenses, labeled as A-G. All of the lenses A-G are preferably cylindrical lenses having spherical, or Plano, figure. Such cylindrical lenses having spherical figure are selected for their relative ease, and low cost, of manufacture, as compared to cylindrical lenses having spherical or Plano figure shown. In addition, besides focusing the line of continuous wave electromagnetic radiation, the totality of the cylindrical lenses significantly reduces any optical aberrations.

Also, in a preferred embodiment, lens A is an expander lens that has a substantially optically flat entry side and a cylindrical exit side. The expander lens is used to expand the continuous wave electromagnetic radiation condensed by the interleave combiner 910(B) (FIGS. 9A and 9B) for subsequent focusing by the remainder of the focusing lenses B-G. For example, in a preferred embodiment, the beam of continuous wave electromagnetic radiation is expanded to 20 mm wide and the fast axis divergence is reduced to less than 0.1°. The reduced divergence makes it possible to achieve a narrower line width. In addition, the wider beam makes it possible to achieve an acceptable working distance for a 0.4 numerical aperture. Once focused by the remainder of the lenses B-G, the resulting beam is approximately 30 microns wide at the surface of the substrate 906.

The final lens G preferably has opposing substantially optically flat entry and exit sides, and acts merely as a quartz window to isolate the wafer environment from the lens environment. It also shifts the focus somewhat away from the radiation source.

In a preferred embodiment, the distance from the window to the substrate is approximately 8 mm. Also, in a preferred embodiment, the lenses A-G have the following prescription data:

Entry beam radius=2.750000; Field angle=0.250000; Primary wavelength=810 nm

| SURFACE | RADIUS | THICKNESS | APERTURE | RADIUS | MATERIAL |
|---|---|---|---|---|---|
| Source | 0.000000 | 1.0000e+20 | 4.3634.17 |  | AIR |
| $A_{entry}$ | 0.000000 | 3.000000 | 4.000000 | X | BK7 |
| $A_{exit}$ | 7.000000 | 28.000000 | 3.000000 | X | AIR |
| $B_{entry}$ | 0.000000 | 5.000000 | 12.500000 | X | BK7 |
| $B_{exit}$ | −23.000000 | 0.000000 | 12.500000 | X | AIR |
| $C_{entry}$ | 74.100000 | 5.000000 | 12.500000 | AX | BK7 |
| $C_{exit}$ | 0.000000 | 0.000000 | 12.500000 | X | AIR |
| $D_{entry}$ | 41.000000 | 5.000000 | 12.500000 | X | AIR |
| $D_{exit}$ | 119.000000 | 0.000000 | 12.500000 | X | AIR |
| $E_{entry}$ | 26.500000 | 5.000000 | 10.000000 | X | BK7 |
| $E_{exit}$ | 44.500000 | 0.000000 | 10.000000 | X | AIR |
| $F_{entry}$ | 12.000000 | 5.000000 | 8.000000 | X | BK7 |
| $F_{exit}$ | 22.800000 | 3.000000 | 8.000000 | X | AIR |
| $G_{entry}$ | 0.000000 | 4.000000 | 10.000000 | X | QUARTZ |
| $G_{exit}$ | 0.000000 | 0.000000 | 3.284151 | SX | AIR |
| Substrate | 0.000000 | 8.42 | 0.114272 | S |  | where radiuses and thicknesses are in millimeters. "SURFACE" refers to the surface of the lens, where "entry" refers to the entry surface of the lens and "exit" refers to the exit surface of the lens. Material refers to the material the lens is made from. "X", "AX" and "SX" data refer to the shape of the aperture, rectangular or elliptical, where "X" means special aperture data, "S" means the aperture radius number in the previous column is calculated rather than specified, "A" means an aperture stop, basically a window that rays must be able to pass through. For example, the entry surface "AENTRY" of lens A (FIG. 11) has a radius of 0 millimeters, i.e., is flat, a thickness of 3 millimeters, an aperture radius of 4 millimeters, has a rectangular shape, and is made from BK7 glass. The above chart was created using Sinclair Optic's OSLO® ray tracing software.

The lenses A-G are preferably held in place within the focusing optics 910(A) by a frame 1102. In a preferred embodiment, the frame 1102 is made from machined stainless steel. The frame 1102 also preferably includes some tolerances to ensure a robust system should the lenses not align in use, where any misalignment merely shifts the line of focus towards or away from the substrate surface (or it moves laterally). This shift in focus is then adjusted by an automated focusing system, as described below in relation to FIGS. 14A-D. In addition, during a preferred use, purge gas is pumped into the frame and through a gas injector 1104 into spaces 1108 between the lenses to keep the lenses cool. This purge gas is preferably Nitrogen, at room temperature (to avoid condensation forming on the lenses).

The detection module 912(A+B+C) preferably includes at least one reflected power detector 912(A) and at least one emitted power detector 912(B). The at least one emitted power detector 912(B) is configured to detect a portion of the emitted continuous wave electromagnetic radiation emitted from the continuous wave electromagnetic radiation source 908(A+B) (FIGS. 9A and 9B), while the at least one reflected power detector 912(A) is configured to detect a portion of reflected continuous wave electromagnetic radiation reflected from the surface of the substrate 906. The emitted power detector 912(B) monitors the output of the continuous wave electromagnetic radiation source, while the reflected power detector 912(A) is used to detect reflectivity, emissivity, energy absorbed by the substrate, and/or the temperature of the substrate. Suitable emitted power detectors 912(B) and reflected power detectors 912(A) are made by Hamamatsu.

The beam splitter 912(C) is configured to sample a portion of the emitted continuous wave electromagnetic radiation by reflecting a portion of the emitted continuous wave electromagnetic radiation incident on a first substantially planar surface thereof towards the emitted power detector 912(B). In a preferred embodiment, a second planar surface (not shown) of the beam splitter 912(C), opposite the first planar surface, is used to reflect continuous wave electromagnetic radiation reflected from the surface of the substrate towards the reflected power detector 912(A). The beam splitter is preferably disposed between the continuous wave electromagnetic radiation source 908(A+B) and stage 904 (FIGS. 9A and 9B). The beam splitter 912(C) is also preferably coated with an anti-reflective coating, such as MgF. In use, the beam splitter 912(C) reflects or samples less than 1% of the continuous wave electromagnetic radiation emitted by the continuous wave electromagnetic radiation source 908(A+B).

In use, the ratio of the detected emitted power to the detected reflected power provides a measurement of the absorption at the substrate. Absorption is the process by which radiant energy is absorbed, converted into other forms of energy, such as heat, and then reradiated at a longer wavelength, according to Planck's Law for thermal radiation.

In a preferred embodiment, the emitted power detector 912(B) and the reflected power detector 912(A) detect continuous wave electromagnetic radiation at 810 nm. Also, in a preferred embodiment, at least one reflected power detector 912(A) is configured as a temperature detector to detect the temperature on the surface of the substrate at the line of continuous wave electromagnetic radiation. To detect temperature, the temperature detector detects continuous wave electromagnetic radiation at a wavelength other than 810 nm, such as 1500 nm. This is achieved by positioning a filter 1106 between the reflected continuous wave electromagnetic radiation and the detector 912(A). The filter 1106 is configured to allow only continuous wave electromagnetic radiation having a wavelength other than 810 nm to reach the detector 912(A), thus making it act as an optical pyrometer. This assures that the detected signal is a reflection signal and not an emission from the light source. In other words, only radiation that is reflected has a wavelength of other than 810 nm. In a preferred embodiment, the filter is configured to allow optical pyrometer operation between 900 nm and 2000 nm, with 1500 nm being a preferred wavelength. This temperature measurement is, however, susceptible to emissivity variation.

The reflected power detector 912(A) and emitted power detector 912(B) also preferably include pinhole apertures to maximize the signal detected while minimizing the collection of any stray radiation that may be scattered within the optics due to the non-zero reflectivity of the lenses in the apparatus.

In a preferred embodiment, which includes 15 and 16 opposing laser diode modules, 15 pairs of reflected power detectors 912(A) and emitted power detectors 912(B) are preferably provided. Every other reflected power detector 912(A) is preferably configured as a temperature detector, as described above.

An alternative embodiment also includes reflectors 1110 positioned between the focusing optics 910(A) and the substrate 906. The reflectors 1110 are configured to reflect radiation reflected from the surface of the substrate back to the line of continuous wave electromagnetic radiation. In a preferred embodiment, the reflectors 1110 are cylindrical mirrors with center of curvature at the focus of the lens.

Figure 12:
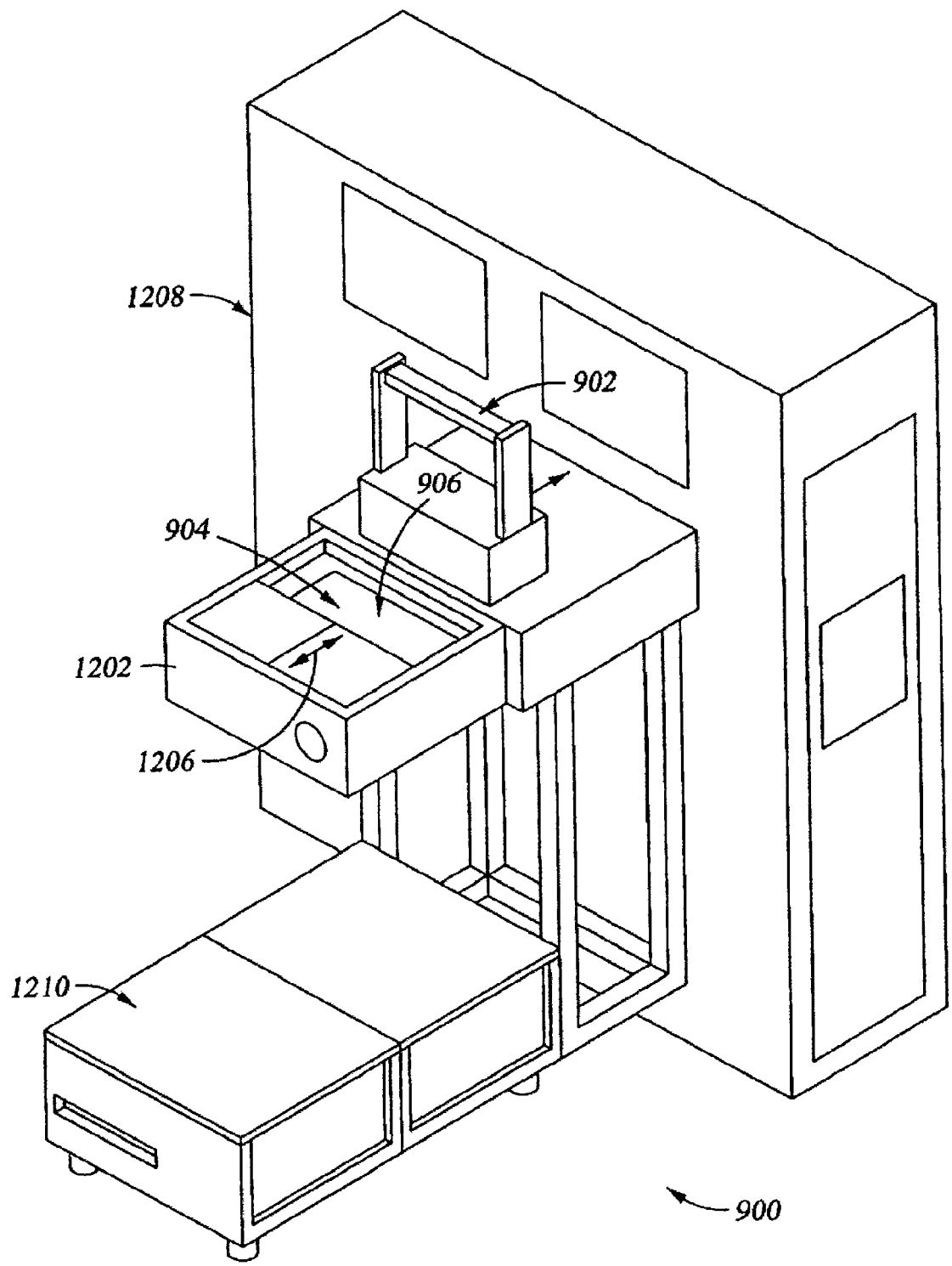
FIG. 12 is an isometric view of a prototype of the apparatus shown in FIGS. 9A and 9B.

FIG. 12 is an isometric view of a prototype of the apparatus 900 shown in FIGS. 9A and 9B. As can be seen, a substrate, such as a semiconductor wafer, is positioned on a stage 904 within a chamber 1202. A continuous wave electromagnetic radiation module 902 is coupled to the chamber 1202. In addition, a translation mechanism, such as the translation mechanism 218 (FIG. 2), moves the stage 904 relative to the continuous wave electromagnetic radiation module 902, as depicted by the arrows 1206. Some of the electronics, such as the computer system 914 (FIGS. 9A and 9B), are contained within a housing 1210. The apparatus 900 is preferably coupled to factor interface 1208 for transferring substrates 906 into or out of the apparatus 900.

Figure 13:
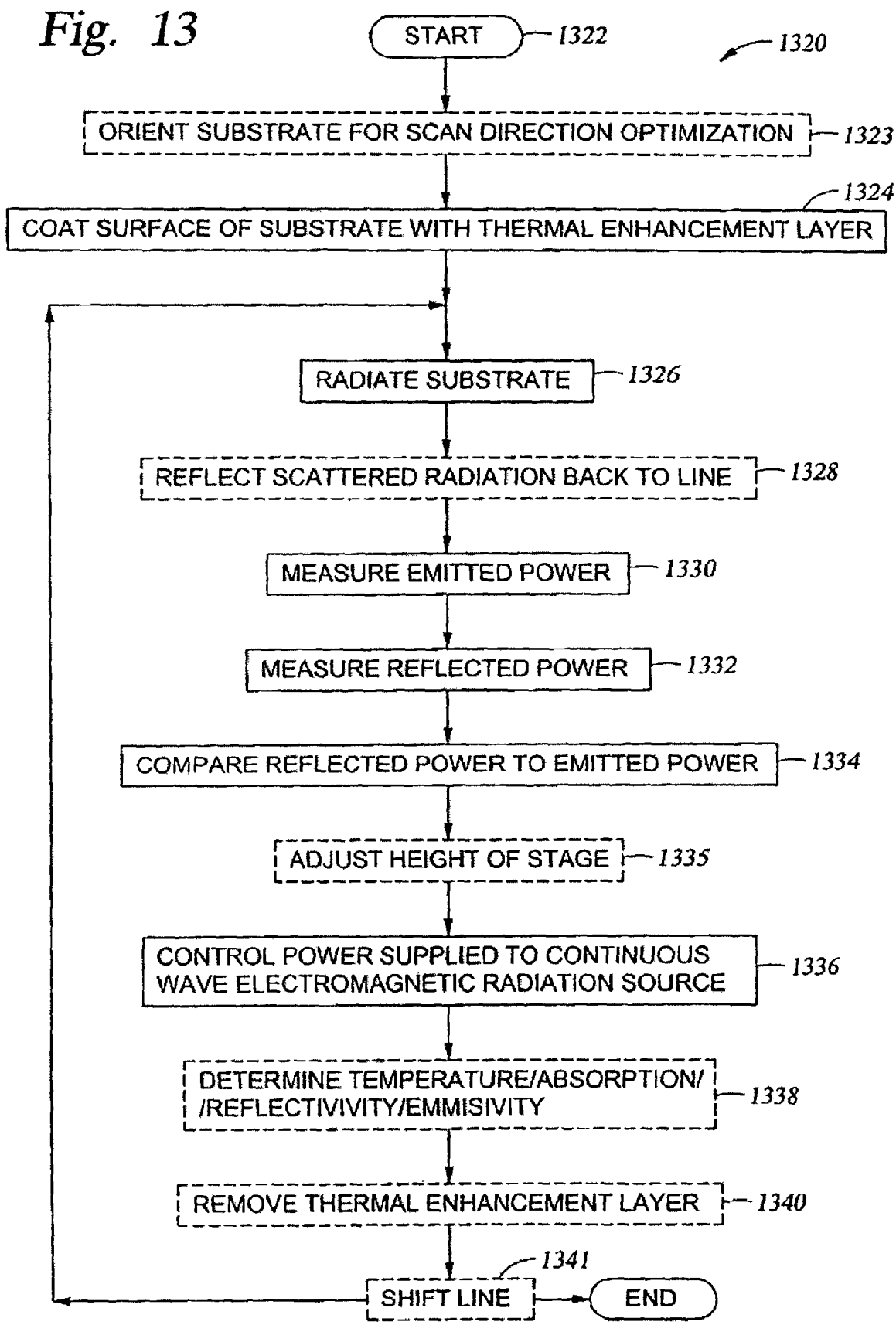
FIG. 13 is a flow chart of a method for controlling a thermal process.

FIG. 13 is a flow chart of a method 1320 for controlling a thermal process. Once the method 1320 has begun, as step 1322, the substrate is oriented on the stage, at step 1323, such that the subsequent direction of the scan will optimize the thermal process. This is undertaken, as different orientations of the substrate have different mechanical properties and the yield strength may be higher in one direction than another. In general, a notch is provided on the substrate to indicate crystallization direction. The surface of the substrate 904 (FIGS. 9A and 9B) may be optionally coated with a thermal enhancement layer at step 1324. The thermal enhancement layer is made from a material having high absorption properties, such as doped poly silicon or silicon nitride, on a buffer layer of oxide, and/or from a material having anti-reflective properties. The thermal enhancement layer helps create an insensitivity to substrate surface conditions. For example, if the surface of the substrate is highly reflective or non-uniform, the thermal enhancement layer helps maintain the substantially homogenous thermal exposure of the substrate.

The substrate is then irradiated with a line of continuous wave electromagnetic radiation emitted from the continuous wave radiation module 908 (FIGS. 9A and 9B), at step 1326, thereby heating the surface of a substrate with a predetermined power density for a predetermined length of time. The predetermined power density is preferably greater than 30 kW/cm$^2$ (preferably 100 kW/cm$^2$), and the predetermined time is preferably between 100 microseconds and 100 milliseconds (preferably about 1 millisecond). This heats the surface of the substrate from an ambient temperature of less than about 500°. to a process temperature of higher than about 700° C. The temperature at a predetermined depth from the surface, such as at 10 times the maximum depth of device structures in Si, remains below the ambient temperature plus half the process temperature less the ambient temperature.

As described above, the line of continuous wave electromagnetic radiation may extend across the entire surface of the substrate or partially across the substrate.

In the embodiment having reflectors 1110 (FIG. 11), any reflected or scattered light directed at the reflectors is reflected back towards the line of radiation at step 1328.

The emitted power is then measured by the emitted power detector(s) 912(B) and transmitted to the computer system 914 (FIG. 9A), at step 1330. The reflected power is then measured by the reflected power detector 912(A) and transmitted to the computer system 914, at step 1332. The computer system 914 then compares the reflected power to the emitted power, at step 1334, and controls the power supplied to the continuous wave electromagnetic radiation source accordingly, at step 1336. For example, the continuous wave electromagnetic radiation source may heat different substrates differently with the same emitted power. The computer system controls power of the power source 916, which in turn may controls individual laser-diode modules, or sets of laser-diode modules, simultaneously. In this way, individual laser-diode modules, or combinations of laser-diode modules (or zones) may be controlled in real time.

In an alternative embodiment, based on the measured emitted power and reflected power, the adjustment mechanism (described below in relation to FIGS. 14A-D) can adjust the height of the stage in real time at step 1335. Adjusting the height of the stage can either bring the surface of the substrate into or out of focus, thereby controlling the power density of the line of continuous wave electromagnetic radiation on the surface of the substrate independently from the total power.

The measured reflected power and emitted power may then be used to calculate reflectivity of the substrate, emissivity of the substrate, energy absorbed by the substrate, and/or the temperature of the substrate at step 1338. The reflectivity is proportional to the reflected power divided by the emitted power. A thermal emission signal from the wafer is measured through the optics and, optionally, through the interleave combiner at a wavelength longer than that of the continuous wave electromagnetic radiation source.

Similarly, the temperature is proportional to the adsorbed power which equals the radiated power less the reflected power. The calculated true temperature is derived from the difference in reflected and emitted power subject to the calibration of the detectors. The exact method is similar to the existing emissivity compensation schemes used for RTP, as is well understood in the art. These calculations are described in the U.S. Pat. Nos. 6,406,179; 6,226,453; 6,183,130; 6,179, 466; 6,179,465; 6,151,446; 6,086,245; 6,056,433; 6,007,241; 5,938,335; 5,848,842; 5,755,511; 5,660,472; all of which are incorporated herein by reference.

If provided, the thermal enhancement layer is then typically removed, at step 1340.

Furthermore, in an alternative embodiment, the thermal exposure uniformity can be improved by over-scanning. Over-scanning utilizes a line of radiation that is longer than the width of the substrate. After each scan, the line of radiation is shifted slightly along its length, at step 1341, such that the overall thermal uniformity is improved if slow axis uniformity degrades over time. The shifting of the line effectively averages out the thermal exposure of the substrate.

Figure 14B:
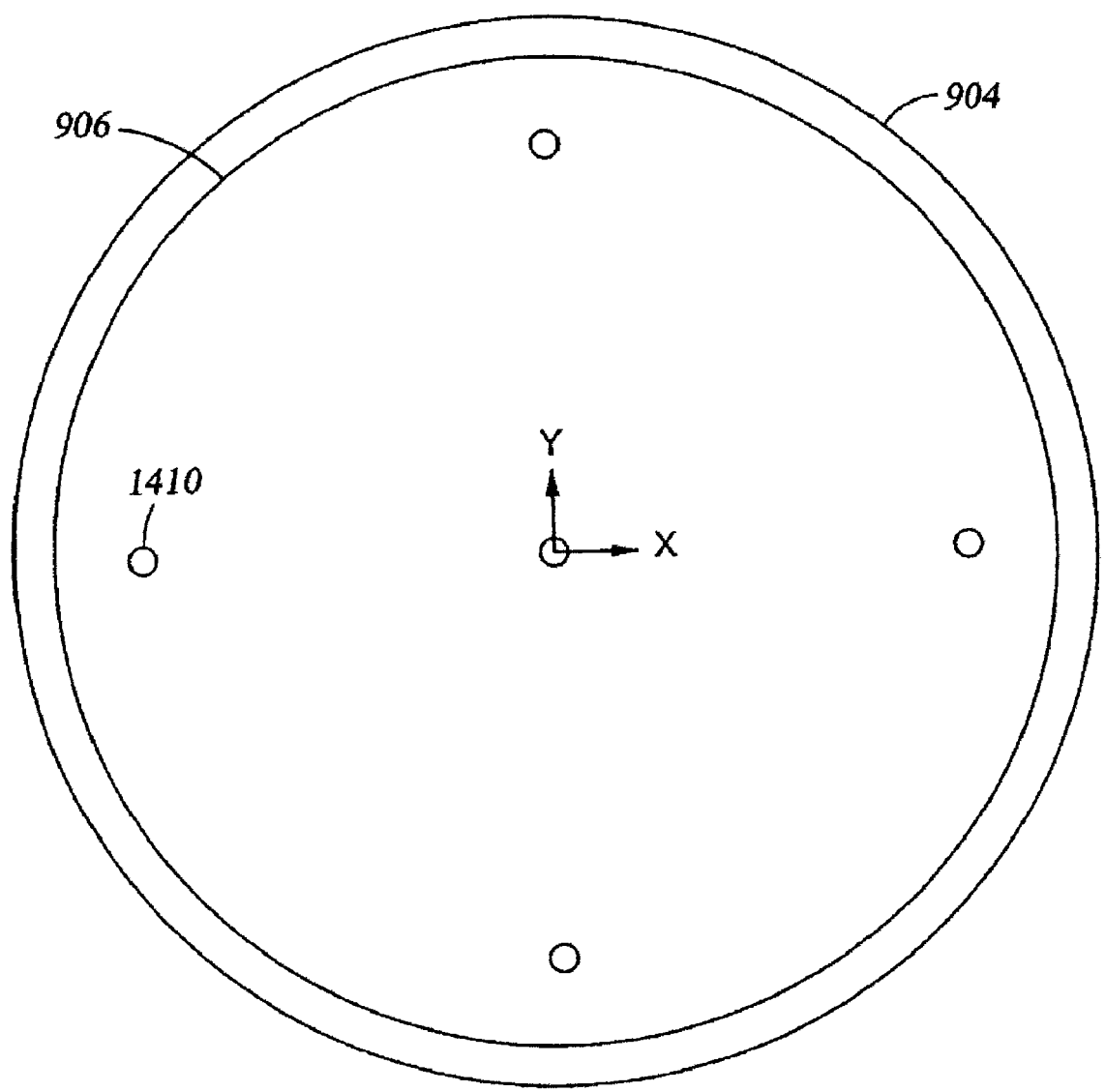
FIG. 14B is a top view of the tooling substrate and stage shown in FIG. 14A, as taken along line 14B-14B'.

FIG. 14A is a partial sectional side view of an automated focusing mechanism 1400, while FIG. 14B is a top view of a tooling substrate and stage 1414 shown in FIG. 14A, as taken along line 14B-14B'. The automated focusing mechanism 1400 is used to focus the line of continuous wave electromagnetic radiation on the upper surface of a substrate from the continuous wave electromagnetic radiation module 902.

The focusing mechanism 1400 preferably includes multiple photo-diode sensors 1408 embedded into a stage 1414. Each of the photo-diode sensors 1408 is electrically coupled to a controller 1404. In a preferred embodiment, five photo-diode sensors 1408 are provided, however, in general, there should be at least three photo-diode sensors 1408 to account for variations in pitch (about the X axis), roll (about the Y axis), and height (along the Z axis), as explained below. The photo-diode sensors 1408 are used during the setup of the system to verify that the upper surface of the tooling substrate is in the plane of focus of the continuous wave electromagnetic radiation source.

In a preferred embodiment, a central photo-diode sensor is used to set up height, and photo-diode sensors to the left and right of the central photo-diode sensor are used for substantially eliminating any tilt or roll (rotation about the Y-axis) of the stage. Leading and trailing photo-diode sensors are used to eliminate any tip or pitch (rotation about the X-axis) of the stage. Adjustments are based upon maximizing the signal of the photo-diode sensors.

Such verifications require a tooling substrate 1412 that is loaded onto the stage 1414 by a substrate loading robot. The tooling substrate 1412 has pinhole apertures 1410 directly above each photo-diode sensor 1410. The pinhole apertures have a smaller diameter than the width of the line, even at best focus.

The controller 1404 is also coupled to an adjustment mechanism 1402. The adjustment mechanism 1402 is configured to raise or lower the stage 1414 (along the Z axis), adjust the pitch (about the X axis), or adjust the roll (about the Y axis), as required by the controller to focus the line of continuous wave electromagnetic radiation on the surface of the tooling substrate.

In a preferred embodiment, the adjustment mechanism 1402 includes at least three rack and pinion drives 1406, each rotatably coupled to the stage at one end of the rack and pinion drive's screw. In use, if all three rack and pinion drives 1406 are raised or lowered together, the stage 904 is raised or lowered. However, if individual rack and pinion drives 1406 are lowered or raised, the pitch and roll of the stage can be adjusted. It should, however, be appreciated that any suitable adjustment mechanism 1402 may be used.

The controller 1404 is also coupled to the translation mechanism 218 for moving the continuous wave electromagnetic radiation source 908(A+B) and the stage 904 relative to one another.

Figure 14C:
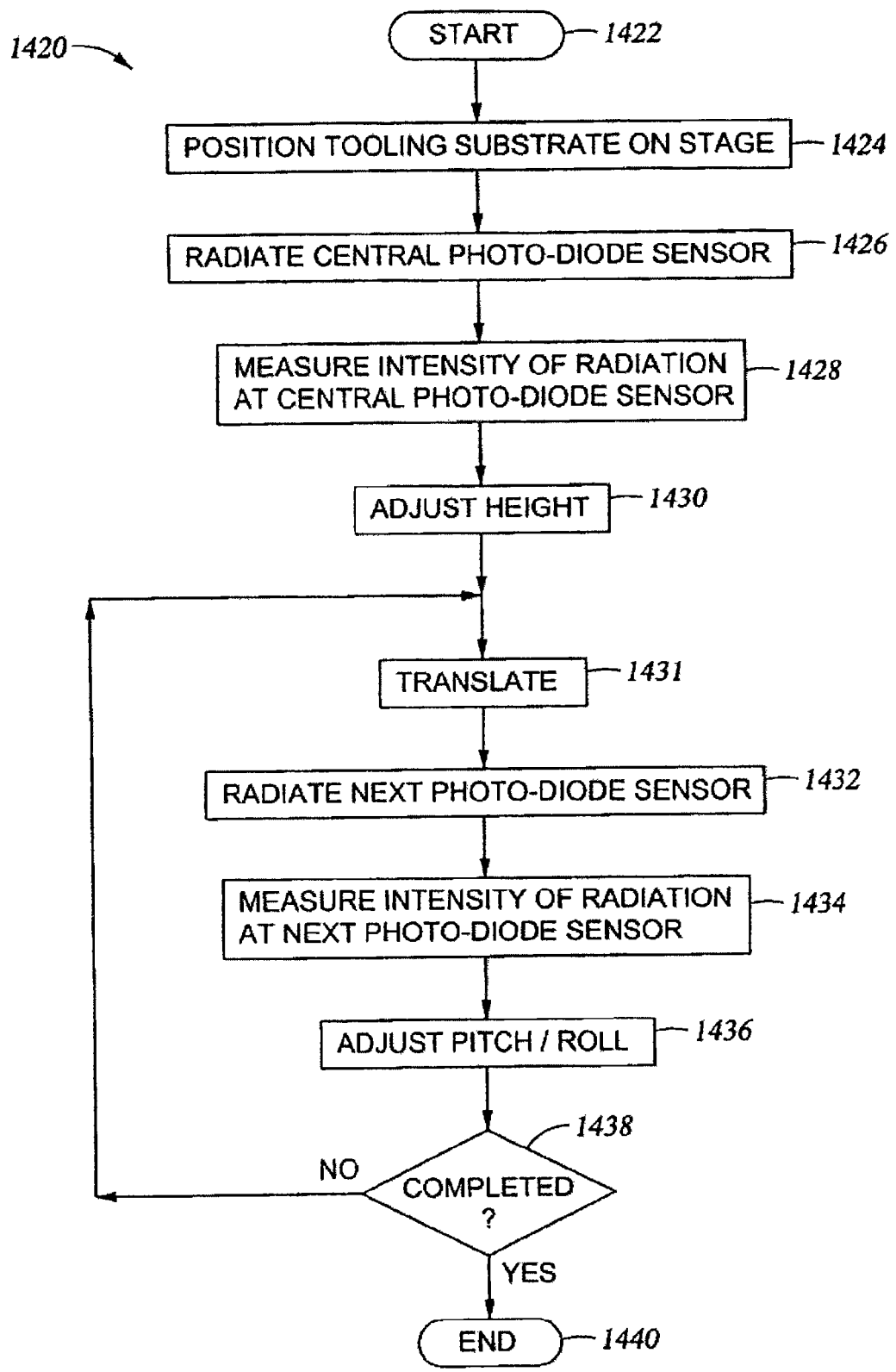
FIG. 14C is a flow chart of a method for automatically focusing a line of continuous wave electromagnetic radiation of an upper surface of a substrate.

FIG. 14C is a flow chart 1420 of a method for automatically focusing a line of continuous wave electromagnetic radiation on an upper surface of a substrate. Once this method is started at step 1422, a tooling substrate 1412 (FIG. 14A) is positioned on the stage, at step 1424. The continuous wave electromagnetic radiation source 908(A+B) then radiates a first photo-diode sensor 1408, at step 1426, such as the central photo-diode positioned below the center of the tooling substrate. The first photo-diode sensor provides the measurement used for absolute height adjustment. The first photo-diode sensor measures the intensity of the continuous wave electromagnetic radiation, at step 1428, and transmits this intensity to the controller 1404. The controller then instructs the adjustment mechanism 1402 to adjust the height of the stage, at step 1430. The height is adjusted by the adjustment mechanism raising or lowering the stage 904 along the Z axis until the line of light is in focus at the aperture in front of the first photo-diode sensor.

The controller then instructs the translation mechanism to translate the continuous wave electromagnetic radiation module and the stage relative to one another, at step 1431, such that the next photo-diode is aligned with the line of radiation. The next photo-diode sensor 1408 (FIG. 14A) is then irradiated at step 1432. The intensity of the continuous wave electromagnetic radiation at this photo-diode sensor is measured, at step 1434, and transmitted to the controller 1404. The controller then instructs the adjustment mechanism 1402 to adjust the pitch and/or roll of the stage by tilting the stage about the X and Y axes, as necessary, to ensure that the line of light is in focus at this photo-diode sensor, at step 1436. The controller then determines, at step 1438, whether the setup has been completed, i.e., whether measurements have been taken from all the photo-diode sensors. If the method is not completed (1438—No), then the radiation module and stage are translated relative to one another until the next photo-diode is aligned with the line of radiation and the next photo-diode irradiated at step 1432, and the method repeated until such time as the line of light is in focus at all points along the surface of the substrate. If the method has completed (1438—Yes), then the process is completed at step 1440.

This process may be either iterative, or, alternatively, complete scans in the Z direction can be made for all detectors prior to adjustment. In this way, the plane of the tooling wafer will become known to the system relative to the plane of focus. At that time, the three servos make the appropriate adjustments to make the two planes coincident.

In a preferred embodiment, after the height has been adjusted, tilt or roll is eliminated using the left and right photo-diode sensors, which will come into and out of focus at different heights if the stage is tilted or rolled. Once tilt or roll is eliminated, the substrate is moved to a leading edge photo-diode sensor and another through focus data-set is collected. Pitch or tip is zeroed out when the central photo-diode sensor and the leading edge photo-diode sensors have the same through focus data at the same heights. The trailing edge photo-diode sensors are used for verifying that the stage is, indeed, level.

Figure 14D:
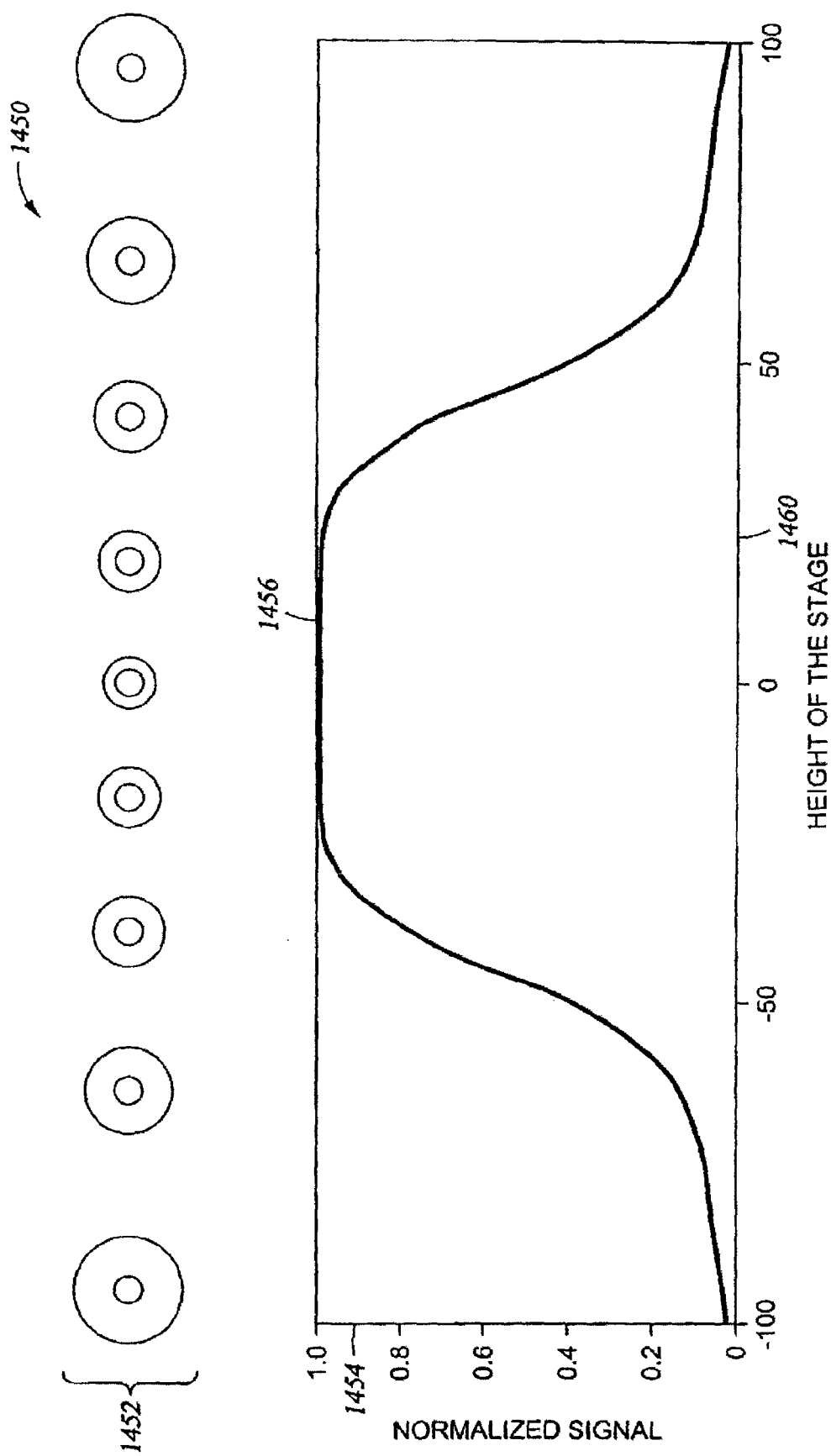
FIG. 14D is a graph of the measured energy density versus the vertical distance from best focus at an aperture.

FIG. 14D is a graph 1450 of the measured energy density (Normalized Signal) 1454 versus the height of the stage 1460, with zero being at best focus, at an aperture 1410 (FIG. 14A). Through focus is shown as 1452. As can be seen, when the line of light is focused at the aperture, at 1456, the energy density is the highest. Also shown is the spot size, i.e., the area over which the energy is spread. The spot is an illustration of where the image of the laser diodes is in the plane of focus. In order to simplify analysis, rotationally symmetric lenses are assumed, i.e., a spot, and not a line, is used for analysis. In actual use, however, the spot is preferably a long line with a width that spreads.

Accordingly, the focusing mechanism 1400 (FIG. 14A) assures a good focus for all substrates. It also allows thermal recipes to vary the line width without having to resort to movable optics, i.e., the power density at the surface of the substrate can be adjusted independently by adjusting the height of the stage without adjusting the total power output from the continuous wave electromagnetic radiation source.

Furthermore, any of the above described systems, apparatuses, or methods may be used with an implanter or Plasma Doping (PLAD). Also, the above-described methods may be used for back end thermal processes that require using a high power continuous wave electromagnetic radiation laser source operating in or near the UV. Once such back end thermal process is copper reflow, where wavelengths produced by such a laser source are strongly absorbed by most materials, including copper.

In addition, the above described apparatuses and methods may be used for isotropic etching and/or ashing, such as etching photoresist off a substrate surface. Such isotropic etching and/or ashing does not require the use of a plasma, and, therefore, does not have any of the associated problems of plasma damage, such as those caused by hot electrons.

What is more, the above described apparatuses and methods may be used for all flat panel anneals. Current laser recrystallization processes raster a laser spot across the surface of the flat panel. Recrystallization generally proceeds radially, thereby making the speed and overscanning critical process control variables. Using the present invention, however, recrystallization proceeds from a broad, continuous front, resulting in the formation of larger grains due to the reduced degree of freedom for recrystallization. In the present invention, recrystallization can only occur in front of and behind the line of radiation, making the scan speed an important variable.

Still further, the above described apparatuses and methods may be used to activate the substrate junction beyond an a-c/Si interface to improve p-n junction leakage, where a-c is an amorphous-crystalline interface. A problem with present annealing methods is that not all defects at an original a-c interface are annealed out. These defects are the end-of-range (EOR) defects for an amorphizing implant. If these defects remain in the junction where voltage must be sustained (depletion region), then the regular array assumption for Silicon is less than perfect and leakage will occur. In the present invention, however, the thermal exposure can be made long enough to move the junction deeper—past the EOR defects. Pulsed lasers are not well suited to do this, as due to the short pulse lengths well below a microsecond, no diffusion can occur.

The foregoing descriptions of specific embodiments of the present invention are presented for purposes of illustration and description. They are not intended to be exhaustive or to limit the invention to the precise forms disclosed. Obviously, many modifications and variations are possible in view of the above teachings. For example, although one beam splitter is described herein for reflecting continuous wave electromagnetic radiation towards both the reflected power detector 912(A) and the emitted power detectors 912(B), more than one beam splitter may be used. The embodiments were chosen and described in order to best explain the principles of the invention and its practical applications to thereby enable other skilled in the art to best utilize the invention and various embodiments with various modifications that are suited to the particular use contemplated. Furthermore, the order of steps in the method are not necessarily intended to occur in the sequence laid out. It is intended that the scope of the invention be defined by the following claims and their equivalents. In addition, any references cited above are incorporated herein by reference.

What is claimed is:

1. A thermal flux apparatus comprising:
    a radiation module;
    a stage; and
    a translation mechanism,
    wherein:
        the radiation module comprises:
            a source of substantially monochromatic light having a wavelength between 190 nm and 950 nm, wherein the source provides the light with a power greater than 0.5 kW; and
            an optical train disposed to receive light from the light source, the optical train including focusing optics to focus the received light to a line of radiation substantially collimated perpendicular to a surface of the stage, the line of radiation having a full-width-at-half-maximum ("FWHM") width between 3 µm and 500 µm and having a FWHM length longer than its width;
            wherein the optical train includes a collimator disposed to collimate the light from the source in a direction substantially perpendicular to the surface of the stage and a focusing element disposed to focus the collimated light into the line of radiation;
            wherein the focusing element comprises a series of lenses;
            wherein the series of lenses comprises a first lens, a final lens, and a plurality of intermediate lenses disposed between the first lens and the final lens such that light from the source encounters the optical train at the first lens and the line of radiation emanates from the final lens; and
            wherein the first lens reduces fast-axis divergence of light passing through the optical train to less than 0.1°; and
        the translation mechanism is adapted to translate the stage and the line of radiation relative to each other.

2. The thermal flux apparatus recited in claim 1 wherein the source provides the light with a power less than 50 kW.

3. The thermal flux apparatus recited in claim 1 wherein the first lens has a substantially flat entry side.

4. The thermal flux apparatus recited in claim 1 wherein the first lens has a cylindrical exit side.

5. The thermal flux apparatus recited in claim 1 wherein each of the lenses comprised by the series of lenses is a cylindrical lens.

6. The thermal flux apparatus recited in claim 5 wherein each of the lenses comprised by the series of lenses has a piano figure.

7. The thermal flux apparatus recited in claim 1 wherein the line of radiation has a power density between 10 kW/cm2 and 200 kW/cm2.

8. The thermal flux apparatus recited in claim 7 wherein the power density is at least 30 kW/cm2.

9. The thermal flux apparatus recited in claim 1 wherein the source of substantially monochromatic light comprises a laser diode.

10. The thermal flux apparatus recited in claim 1 wherein the source of substantially monochromatic light comprises a plurality of laser diodes, each of the plurality of laser diodes producing light at substantially the same wavelength.

11. The thermal flux apparatus recited in claim 1 wherein the line of radiation has a substantially uniform radiation distribution.

12. The thermal flux apparatus recited in claim 1 wherein the wavelength is approximately 810 nm.

13. The thermal flux apparatus recited in claim 1 wherein the wavelength is substantially 808 nm.

14. The thermal flux apparatus recited in claim 1 wherein the line of radiation has a FWHM length less than 200 nm.

* * * * *

UNITED STATES PATENT AND TRADEMARK OFFICE
CERTIFICATE OF CORRECTION

| | | |
|---|---|---|
| PATENT NO. | : 7,872,209 B2 | Page 1 of 1 |
| APPLICATION NO. | : 11/924298 | |
| DATED | : January 18, 2011 | |
| INVENTOR(S) | : Dean C. Jennings et al. | |

It is certified that error appears in the above-identified patent and that said Letters Patent is hereby corrected as shown below:

Column 26, claim 6, line 42, delete "piano" and insert --plano--

Signed and Sealed this
Twelfth Day of April, 2011

David J. Kappos
*Director of the United States Patent and Trademark Office*